(12) United States Patent
Krzyzewski et al.

(10) Patent No.: US 10,983,139 B1
(45) Date of Patent: Apr. 20, 2021

(54) LEVITATED CHARGED NANOPARTICLES AS A RADIO FREQUENCY TRANSDUCER

(71) Applicants: Government of the United States, as represented by the Secretary of the Air Force, Kirtland AFB, NM (US); Utah State University Space Dynamics Laboratory, North Logan, UT (US)

(72) Inventors: Sean Krzyzewski, Albuquerque, NM (US); Maxwell D. Gregoire, Albuquerque, NM (US); Brian L. Kasch, Albuquerque, NM (US)

(73) Assignees: Government of the United States, as represented by the Secretary of the Air Force, Washington, DC (US); Utah State University Space Dynamics Laboratory, North Logan, UT (US)

( * ) Notice: Subject to any disclaimer, the term of this patent is extended or adjusted under 35 U.S.C. 154(b) by 0 days.

(21) Appl. No.: 16/810,333

(22) Filed: Mar. 5, 2020

Related U.S. Application Data

(63) Continuation-in-part of application No. 16/268,271, filed on Feb. 5, 2019.

(60) Provisional application No. 62/652,814, filed on Apr. 4, 2018.

(51) Int. Cl.
| | |
|---|---|
| *G01P 3/36* | (2006.01) |
| *B82Y 35/00* | (2011.01) |
| *G01N 27/414* | (2006.01) |
| *H03B 17/00* | (2006.01) |

(52) U.S. Cl.
CPC .............. *G01P 3/36* (2013.01); *B82Y 35/00* (2013.01); *G01N 27/4146* (2013.01); *H03B 17/00* (2013.01)

(58) Field of Classification Search
CPC ...... G01P 1/07; G01P 1/12; G01P 3/36; G01P 15/093; G01N 27/4146; H03B 17/00; H03L 7/26
See application file for complete search history.

(56) References Cited

U.S. PATENT DOCUMENTS 10,199,560 B2    2/2019    Sirbuly et al.

OTHER PUBLICATIONS

Yin, Z., et al., "Optomechanics of Levitated Dielectric Particles," Int. J. Mod. Phys. B 27, Aug. 22, 2013, pp. 1-16.
Li, T., et al., "Measurement of the Instantaneous Velocity of a Brownian Particle," Science, vol. 328, Jun. 25, 2010, pp. 1673-1675.

(Continued)

*Primary Examiner* — Benjamin R Schmitt
(74) *Attorney, Agent, or Firm* — Rahman LLC; David L. Narciso; Dale E. Andersen, Jr.

(57) ABSTRACT

A system includes a vacuum chamber to receive a laser beam and a charged nanoparticle. The nanoparticle oscillates at a trapping frequency in a focus of the laser beam. Resonant oscillation of the nanoparticle is driven by a presence of an ambient electric field adjacent to the vacuum chamber. The system also includes a controller to tune the trapping frequency of an oscillating nanoparticle to be in resonance with the ambient electric field causing on-resonant enhancement of the system; a detector to detect positional changes of the oscillating nanoparticle; and a processor to calculate an electromagnetic force of the ambient electric field based on the positional changes of the oscillating nanoparticle.

20 Claims, 18 Drawing Sheets

(56) References Cited

OTHER PUBLICATIONS

Gieseler, J., et. al., "Subkelvin parametric feedback cooling of a laser-trapped nanoparticle," Phys. Rev. Lett. 109, 103603-1 to 103603-5 with Supplementary Information S1-S10, Sep. 7, 2012.
Ranjit, G., et al., "Zeptonewton force sensing with nanospheres in an optical lattice," Phys. Rev. A 93, Mar. 10, 2016, pp. 1-5.
Monteiro, F., et al., "Optical levitation of 10 nanogram spheres with nano-g acceleration sensitivity," Phys. Rev. A 96, 063841, Nov. 13, 2017, pp. 1-7.
Butts, D., "Development of a Light Force Accelerometer," Ph.D. thesis, Massachusetts Institute of Technology, May 2008, 96 pages.
Ashkin, A., et al., "Optical levitation in high vacuum," Appl. Phys. Lett. vol. 28, No. 6, Mar. 15, 1976, pp. 333-335.
Ranjit, G., et al., "Attonewton force detection using microspheres in a dual-beam optical trap in high vacuum," Phys. Rev. A 91, 051805(R), May 26, 2015, pp. 1-5.
Moore, D., et al., "Search for Millicharged Particles Using Optically Levitated Microspheres," Physical Review Letters, vol. 113, 251801, Dec. 19, 2014, pp. 1-5.
Hempston, D., et al., "Force sensing with an optically levitated charged nanoparticle," Appl. Phys. Lett. vol. 111, 133111, Sep. 28, 2017, pp. 1-4.
Delić, U., et al., "Cavity Cooling of a Levitated Nanosphere by Coherent Scattering," Physical Review Letters, vol. 122, 123602, Mar. 27, 2019, pp. 1-6.
Windey, D., et al., "Cavity-Based 3D Cooling of a Levitated Nanoparticle via Coherent Scattering," Physical Review Letters, vol. 122, 123601, Mar. 27, 2019, pp. 1-5.
Frimmer, M., et al., "Controlling the net charge on a nanoparticle optically levitated in vacuum," Physical Review A, vol. 95, 061801(R), Jun. 6, 2017, pp. 1-4.
Caldani, R., et al, "A prototype industrial laser system for cold atom inertial sensing in space," Eur. Phys. J.D., vol. 73, 248, Dec. 5, 2019, pp. 1-9.

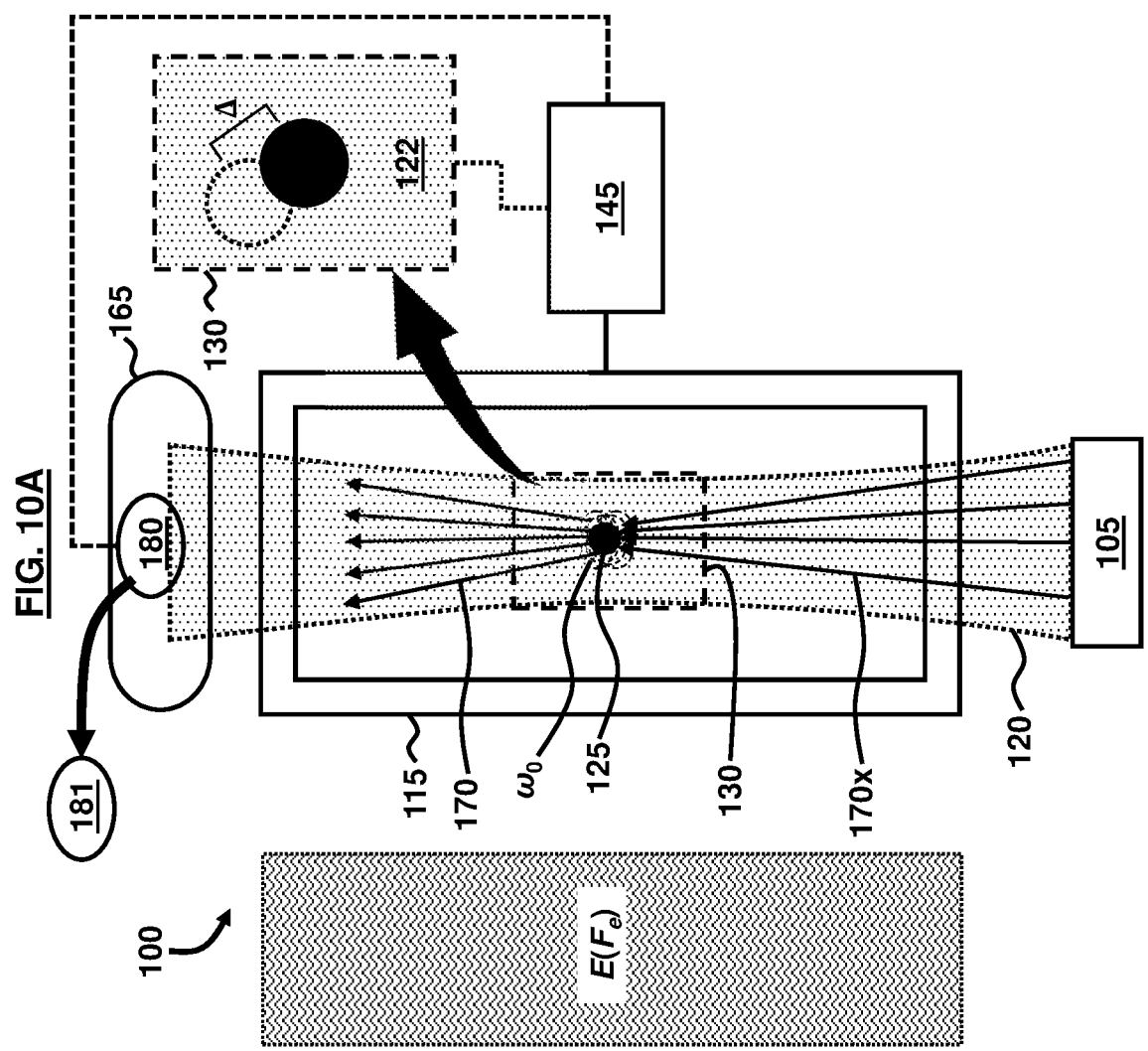

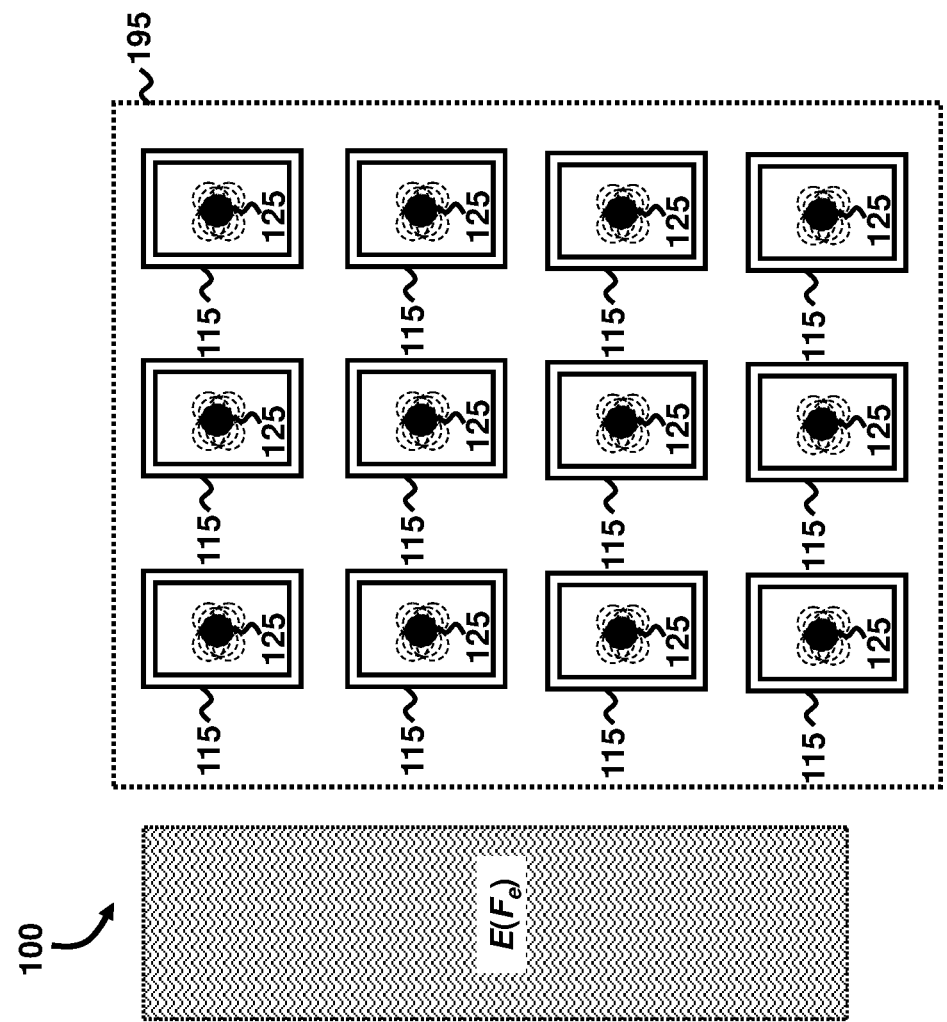

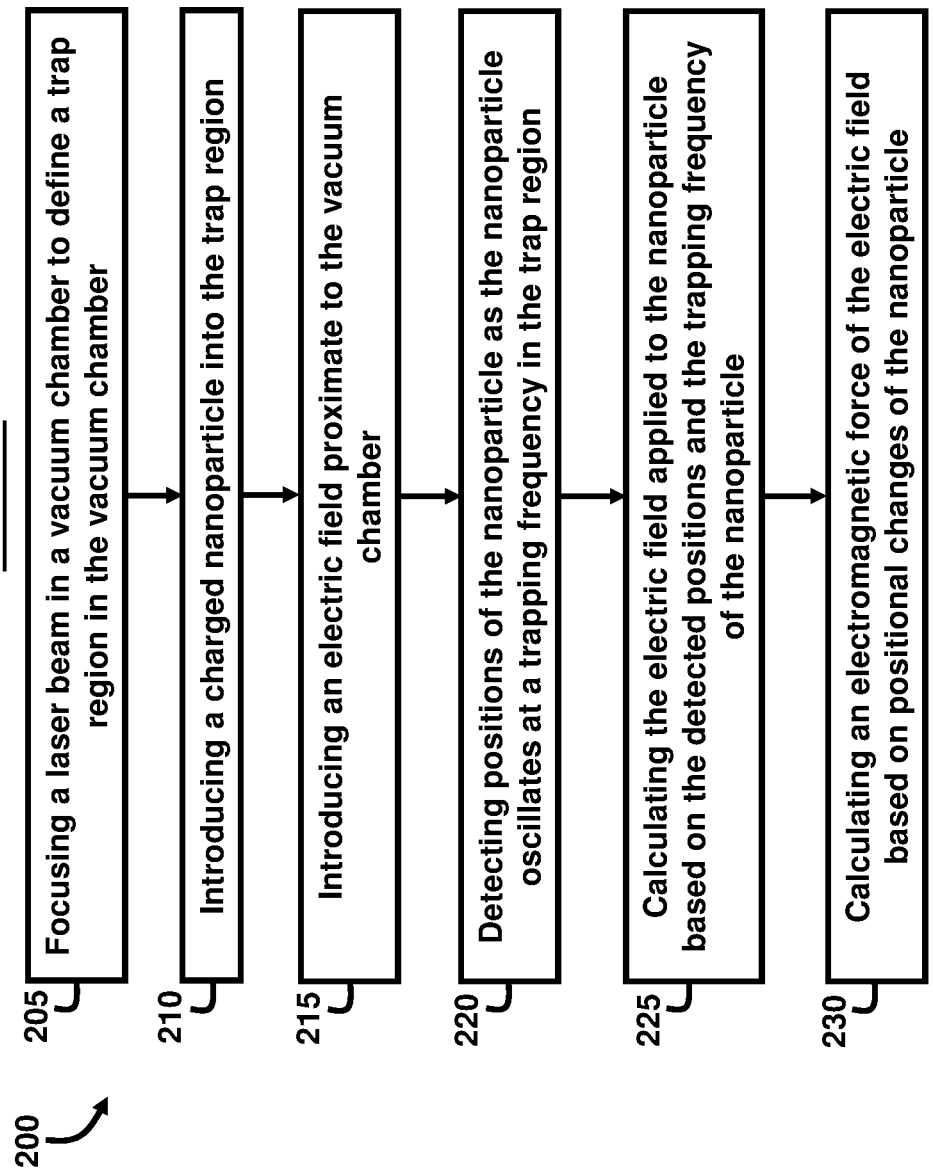

Quantizing an electric charge applied to the nanoparticle

Tuning the trapping frequency to be in resonance with the electric field

Adjusting a power of the laser beam

Controlling a size of the trap region

LEVITATED CHARGED NANOPARTICLES AS A RADIO FREQUENCY TRANSDUCER

CROSS-REFERENCE TO RELATED APPLICATION(S)

This application is a continuation-in-part of U.S. patent application Ser. No. 16/268,271 filed on Feb. 5, 2019, which claims priority to U.S. Provisional Patent Application No. 62/652,814 filed on Apr. 4, 2018, the complete disclosures of which, in their entireties, are herein incorporated by reference.

GOVERNMENT INTEREST

This invention was made with government support under contract FA9453-18-D-0042 awarded by The Air Force Research Laboratory. The government has certain rights in the invention.

BACKGROUND

Field of the Invention

The embodiments herein generally relate to optomechanics, and more particularly to techniques for utilizing optically levitated nanoparticles for conducting electric field measurements.

Background of the Invention

Nanoparticles have been loaded into optical tweezers for several decades and used for measurements of various types of forces and demonstrations of quantum behavior. Charged optically levitated nanoparticles have been used as extremely sensitive force sensors for electromagnetic (EM) fields. Some techniques require receiving antennas that are on the order of the wavelength and require precise calibration. Typical EM antennas are on the order of the wavelength of the EM field. For this reason, most frequencies used for communication between small or handheld devices are in the GHz range where the antenna can be centimeters in size. However, these high frequency waves are attenuated quickly in most materials. Ultra-low (300 to 3000 Hz), low (30 kHz to 300 kHz), and medium (300 kHz to 3 MHz) frequency waves, on the other hand, can travel through rock or water, and are therefore used for applications such as long distance, underwater, or subterranean communication or tunnel detection. Signals sent using these low-frequency waves are also difficult to jam or spoof due to the high power and size requirements of a transmitter operating at those frequencies. Unfortunately, these applications generally necessitate antennae that may be several feet in size, which can be impractical. To mitigate this problem, loop antennas or electrode pairs are typically used; however, the trade-off is that they can only operate in a narrow frequency band.

BRIEF SUMMARY OF THE INVENTION

In view of the foregoing, an embodiment herein provides a system comprising a vacuum chamber to receive a laser beam and a charged nanoparticle, wherein the nanoparticle oscillates at a trapping frequency in a focus of the laser beam, and wherein resonant oscillation of the nanoparticle is driven by a presence of an ambient electric field adjacent to the vacuum chamber; a controller to tune the trapping frequency of an oscillating nanoparticle to be in resonance with the ambient electric field causing on-resonant enhancement of the system; a detector to detect positional changes of the oscillating nanoparticle; and a processor to calculate an electromagnetic force of the ambient electric field based on the positional changes of the oscillating nanoparticle.

The detector may comprise a plurality of photodetectors that are spaced apart to identify spatial coordinates of the oscillating nanoparticle at the trapping frequency. The processor may calculate the electromagnetic force of the ambient electric field based on changes in the spatial coordinates of the oscillating nanoparticle at the trapping frequency. The processor may identify the ambient electric field based on the calculated electromagnetic force. The processor may continuously measure the ambient electric field. The ambient electric field may comprise a radio frequency wave.

Another embodiment provides a system comprising a laser source to generate a laser beam; a vacuum chamber comprising a levitating charged nanoparticle oscillating at a trapping frequency in a focus of the laser beam, wherein the nanoparticle scatters light, and wherein resonant oscillation of the nanoparticle is driven by a presence of an electric field outside of the vacuum chamber; at least one sensor to detect a position of the nanoparticle; and a processor (i) to determine a displacement in the position of the nanoparticle as well as the trapping frequency while the nanoparticle is oscillating in the focus of the laser beam, and (ii) to calculate an electromagnetic force of the electric field based on a frequency and an amplitude of a motion of the nanoparticle.

The at least one sensor may comprise an array of photodiode sensors to monitor an interference between scattered light emitting from the nanoparticle and light from the laser beam that is not scattered by the nanoparticle, and determine a three-dimensional motion of the nanoparticle while the nanoparticle is oscillating at the trapping frequency in the focus of the laser beam. The at least one sensor may comprise an electric image sensor to monitor the interference between the scattered light emitting from the nanoparticle and the light from the laser beam that is not scattered by the nanoparticle, and wherein the processor is to determine a three-dimensional motion of the nanoparticle while the nanoparticle is oscillating at the trapping frequency in the focus of the laser beam based on the monitored scattered light.

The electric image sensor may comprise a charge-coupled device (CCD). The electric image sensor may comprise a complementary metal-oxide-semiconductor (CMOS) camera. The system may comprise a controller to tune the trapping frequency of the nanoparticle to be in resonance with the electric field. The controller may comprise a modulator to control an intensity of the laser beam to tune the trapping frequency.

Another embodiment provides a method of identifying an electric field, the method comprising focusing a laser beam in a vacuum chamber to define a trap region in the vacuum chamber; introducing a charged nanoparticle into the trap region; introducing an electric field proximate to the vacuum chamber; detecting positions of the nanoparticle as the nanoparticle oscillates at a trapping frequency in the trap region; calculating the electric field applied to the nanoparticle based on the detected positions and the trapping frequency of the nanoparticle; and calculating an electromagnetic force of the electric field based on the positional changes of the nanoparticle.

The method may comprise quantizing an electric charge applied to the nanoparticle. The method may comprise tuning the trapping frequency to be in resonance with the electric field. The tuning of the trapping frequency may comprise adjusting a power of the laser beam. The tuning of the trapping frequency may comprise controlling a size of the trap region. The method may comprise arranging a plurality of vacuum chambers comprising respective oscillating nanoparticles into an array; and measuring the electric field at each of the vacuum chambers. The method may comprise charging the nanoparticles to have different charges from one another; and differentiating signals received by the nanoparticles. The method may comprise introducing a plurality of oscillating charged nanoparticles in the vacuum chamber; creating multiple beam trap regions in the vacuum chamber, wherein each beam trap region comprises a charged nanoparticle; and measuring the electric field.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 10A is a schematic block diagram illustrating the system of FIG. 9 with a charge-coupled device (CCD), according to an embodiment herein;

FIG. 13 is a schematic block diagram illustrating the system of FIG. 6 arranged in an array of vacuum chambers with respective nanoparticles, according to an embodiment herein;

FIG. 14A is a flow diagram illustrating a method of calculating an electromagnetic force of an electric field applied to a nanoparticle, according to an embodiment herein;

DETAILED DESCRIPTION OF THE INVENTION

Figure 1:
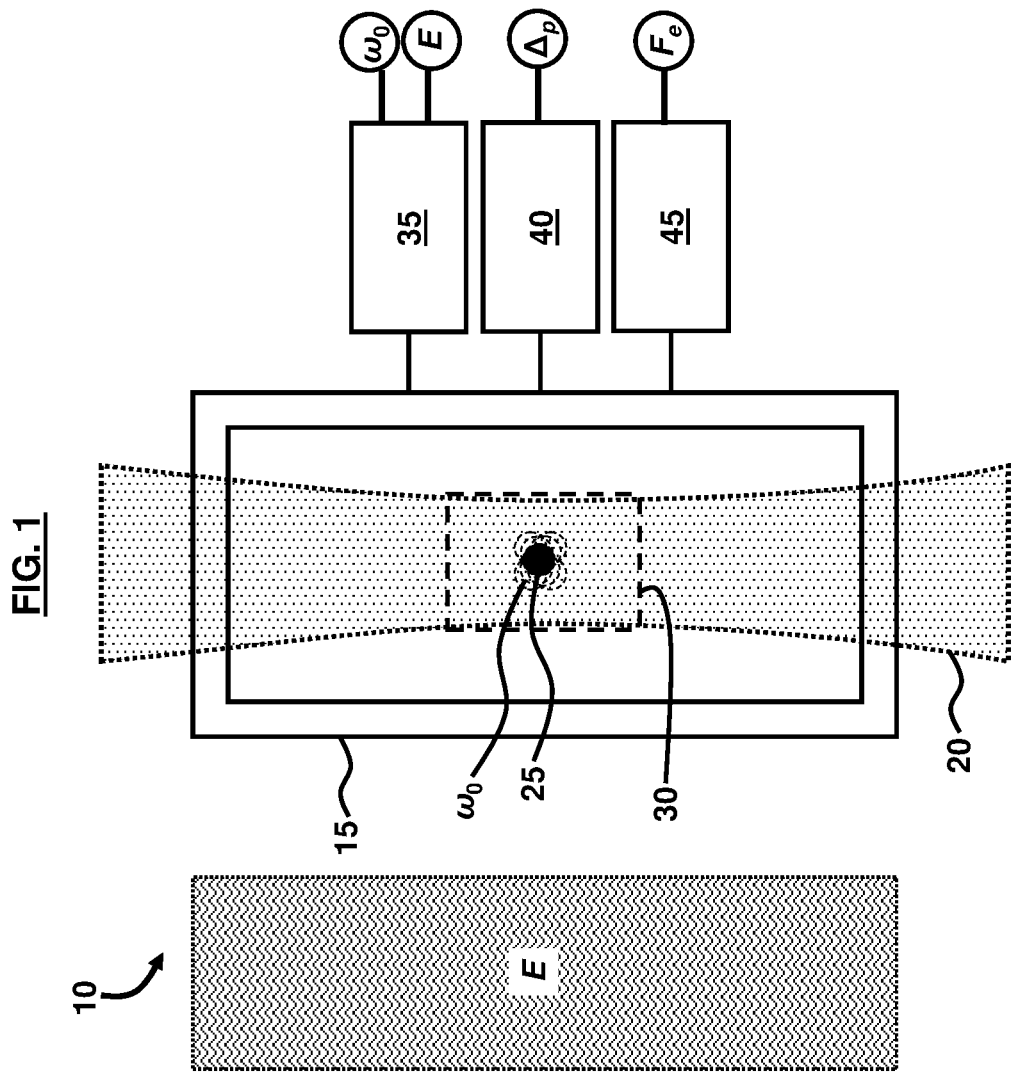
FIG. 1 is a schematic block diagram illustrating a system to calculate an electromagnetic force of an electric field using properties of a nanoparticle, according to an embodiment herein.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

The embodiments herein utilize charged optically levitated nanoparticles that are indefinitely trapped to continuously detect an electric field in the hundreds of Hz to MHz regime and measure the electromagnetic force of the electric field. An example provides an opto-mechanical device that can detect electric fields across a broad, low-frequency spectrum. In some examples, the charged optically levitated nanoparticles may be utilized as an antenna or transducer. In other examples, the resonantly enhanced motion of charged nanoparticles may be incorporated in an optical tweezer to detect AC (AM and FM) electric fields. The techniques provided by the embodiments herein allow for low frequency detection in a small package.

Referring now to the drawings, and more particularly to FIGS. 1 through 14H, where similar reference characters denote corresponding features consistently throughout, there are shown exemplary embodiments. In the drawings, the size and relative sizes of components, layers, and regions may be exaggerated for clarity.

FIG. 1 is a block diagram illustrating a system 10 comprising a vacuum chamber 15 to receive a laser beam 20 and an electrically charged nanoparticle 25. In some non-limiting examples, the nanoparticle 25 may have one or two electron charges present. The nanoparticle 25 oscillates at a trapping frequency $\omega_0$ in a focus 30 of the laser beam 20, and the resonant oscillation of the nanoparticle 25 is driven by a presence of an ambient electric field E adjacent to the vacuum chamber 15. According to some examples, the laser beam 20 may comprise any suitable wavelength of light such as 532 nm, 1064 nm, and 1550 nm, although other suitable wavelengths may be utilized in accordance with the embodiments herein. In an example, the nanoparticle 25 may be a sub-wavelength-sized particle, although any suitably sized nanoparticle 25 may be used in accordance with the embodiments herein. In an example, the diameter of the nanoparticle 25 may be smaller than a wavelength of the laser beam 20, around 100-200 nm. In another example, the nanoparticle 25 may be a highly charged nanoparticle (i.e., q=±5) having a diameter of approximately 1-2 microns.

The charged nanoparticle 25 may comprise various materials such as silica, silicon, or diamond, for example, and may have some non-zero polarizability and therefore is attracted to regions of higher electric field density; i.e. the center of the focus 30 of the laser beam 20. Thus, the nanoparticle 25 is "levitated", or held in space by the laser beam 20. As such, the laser beam 20 is focused to a point in space; e.g., the focus 30, in the vacuum chamber 15 in order to levitate the nanoparticle 25. Accordingly, the focus 30 may be considered as an optical dipole trap for holding the suspended nanoparticle 25 at the trapping frequency $\omega_0$. The nanoparticle 25 may be trapped by a single laser beam 20 regardless of any corresponding gravitational fields applied to the nanoparticle 25. The nanoparticle 25 may be smaller than the wavelength of light, and does not reflect light like microspheres, and instead the nanoparticle 25 is attracted to the focus 30 of the laser beam 20 by virtue of the polarizability of the nanoparticle 25. Furthermore, the vacuum chamber 15 is not restricted to a high vacuum environment so long as signals are not obscured and reductions in sensitivity are not reduced by collisions of the nanoparticle 25 with air molecules.

Some example techniques of electrically charging the nanoparticle 25 may include: (1) Directing electrons at the nanoparticle 25 from an electron gun or other electron source (not shown). (2) Hitting the nanoparticle 25 with light from a lamp, LED, laser, or other light source (not shown in FIG. 1) that causes the nanoparticle 25 to eject electrons. This happens when the energy of the photons in the light source is comparable to the work function of the material of the nanoparticle 25. (3) Bouncing electrons from an electron gun or other electron source off a piece of metal (not shown) adjacent to the nanoparticle 25 and directing the electrons to the nanoparticle 25. In an example, the piece of metal may comprise gold or any other suitable metal that deflects electrons. (4) Hitting a piece of metal adjacent to the nanoparticle 25 with light that causes the metal to emit electrons, and then directing the electrons to the nanoparticle 25. (5) Prior to ejecting the nanoparticle 25 into the vacuum chamber 15, the nanoparticle 25 can be attached to some type of surface (not shown). If the nanoparticle 25 and surface materials have different electron affinity, the nanoparticle 25 will have a natural tendency to be charged upon being ejected. If the surface is charged with electrons via any of the ways described above, or if the surface is charged via a voltage supply, some of that charge will spread to the nanoparticle 25 attached to that surface, causing the nanoparticle 25 to be charged upon ejection into the vacuum chamber 15. Furthermore, other suitable techniques of charging the nanoparticle 25 are possible, and the embodiments herein are not restricted to any particle technique and are not restricted to only one of the techniques described above.

In the context of the embodiments herein, the term "adjacent" as it refers to the ambient electric field E in relation to the vacuum chamber 15 containing the nanoparticle 25 may be defined as any distance or area containing the ambient electric field E that attempts to drive the nanoparticle 25 to oscillate at resonance with the ambient electric field E. While the drawings depict the ambient electric field E positioned at a particular region with respect to the vacuum chamber 15, this is merely for illustrative purposes only, and accordingly the ambient electric field E may completely or partially surround the vacuum chamber 15. Furthermore, there are several factors that could affect the oscillation of the nanoparticle 25 including, for example, the type and strength of the ambient electric field E, the size and/or type of nanoparticle 25, and the characteristics of the vacuum chamber 15 such as the material properties or thickness, etc.

A controller 35 is provided to tune the trapping frequency $\omega_0$ of an oscillating nanoparticle 25 to be in resonance with the ambient electric field E causing on-resonant enhancement of the system 10. In some examples, the controller 35 may comprise any of an electrical, mechanical, optical, magnetic, or atomic devices that control the trapping frequency $\omega_0$ of the oscillating nanoparticle 25. For example, the controller 35 may comprise an oscillator to adjust the trapping frequency $\omega_0$ of the oscillating nanoparticle 25 such that when the controller 35 detects resonance of the trapping frequency $\omega_0$ of the oscillating nanoparticle 25 with the frequency of the ambient electric field E, then the system 10 may detect the signal characteristics of the ambient electric field E, which may otherwise go undetected absent the on-resonant enhancement of the system 10.

A detector 40 is provided to detect positional changes $\Delta_p$ of the oscillating nanoparticle 25. The detector 40 may comprise any of an electrical, chemical, mechanical, optical, or magnetic detector, or a combination thereof used to detect the positional changes $\Delta_p$ of the oscillating nanoparticle 25. In an example, the detector 40 may be positioned inside or outside the vacuum chamber 15 and may utilize image detection and processing techniques to detect and compare the positional changes $\Delta_p$ of the nanoparticle 25 as the nanoparticle 25 oscillates in the vacuum chamber 15. Moreover, the nanoparticle 25 constantly scatters light from the trapping laser beam 20 in the form of spherical waves; i.e., photons traveling away from the nanoparticle 25 in random directions. Accordingly, the detector 40 may monitor the position of the nanoparticle 25 based on light emitted by the nanoparticle 25 as the nanoparticle 25 oscillates.

More specifically, the position of the nanoparticle 25 can be monitored quasi-continuously while in the vacuum chamber 15, for example, by monitoring the interference pattern between the trapping laser and the light scattered by the nanoparticle 25 or by monitoring the transmission of an optical cavity (not shown) surrounding the vacuum chamber 15. When a force $F_e$ acts on the nanoparticle 25 or the vacuum chamber 15, the nanoparticle 25 will move within the vacuum chamber 15. By detecting the position of the nanoparticle 25 by the detector 40 with respect to time, the force $F_e$ on the nanoparticle 25 can be calculated by a processor 45, as further described below. Industry-reported position sensitivities are on the order of $10^{-14}$ m/$\sqrt{\text{Hz}}$ and force sensitivities are on the order of $10^{-20}$ N/$\sqrt{\text{Hz}}$. These results may be due to the relatively low amount of coupling between the trapped nanoparticle 25 and the environment (i.e., the high mechanical quality factor). To achieve such decoupling, the system 10 may be operated in high or ultra-high vacuum, according to an example.

The detector 40 may be wirelessly connected to the controller 35 and/or processor 45 or may be operatively connected through a wired connection such that the detector 40 may send/receive signals (including mobile communication signals) to/from the controller 35 and/or processor 45 to transmit the signatures or measurands detected by the detector 40. For example, the mobile communication signals may be signals in accordance with any suitable type of communication standard or protocol such as the 802.11b wireless communication standard, as well as Bluetooth®, ZigBee®, and Radio-frequency identification (RFID) standards, for example. Accordingly, as described above, the controller 35, detector 40, and the processor 45 may be wired or wirelessly linked to one another. In a wireless connection, the processor 45 may be configured in a separate device or may be part of a server device (not shown) communicating with linked devices in a client/server relationship and, in one example, through a cloud computing environment.

The processor 45 is provided to calculate an electromagnetic force $F_e$ of the ambient electric field E based on the positional changes $\Delta_p$ of the oscillating nanoparticle 25. Various examples described herein with respect to the processor 45 may include both hardware and software elements. The examples that are implemented in software may include firmware, resident software, microcode, etc. Other examples may include a computer program product configured to include a pre-configured set of instructions, which when performed or executed by a computer, may result in actions as stated in conjunction with the techniques described above. In an example, the pre-configured set of instructions may be stored on a tangible non-transitory computer readable medium or a program storage device containing software code.

In some examples, the processor 45 and various other processing devices described herein and/or illustrated in the figures may be embodied as hardware-enabled modules and may be configured as a plurality of overlapping or independent electronic circuits, devices, and discrete elements packaged onto a circuit board to provide data and signal processing functionality within a computer and/or electronic device. An example might be a comparator, inverter, or flip-flop, which could include a plurality of transistors and other supporting devices and circuit elements. The modules that are configured with electronic circuits process computer logic instructions capable of providing digital and/or analog signals for performing various functions as described herein. The various functions can further be embodied and physically saved as any of data structures, data paths, data objects, data object models, object files, database components. For example, the data objects could be configured as a digital packet of structured data. The data structures could be configured as any of an array, tuple, map, union, variant, set, graph, tree, node, and an object, which may be stored and retrieved by computer memory and may be managed by processors, compilers, and other computer hardware components. The data paths can be configured as part of a computer central processing unit (CPU) that performs operations and calculations as instructed by the computer logic instructions. The data paths could include digital electronic circuits, multipliers, registers, and buses capable of performing data processing operations and arithmetic operations (e.g., Add, Subtract, etc.), bitwise logical operations (AND, OR, XOR, etc.), bit shift operations (e.g., arithmetic, logical, rotate, etc.), complex operations (e.g., using single clock calculations, sequential calculations, iterative calculations, etc.). The data objects may be configured as physical locations in computer memory and can be a variable, a data structure, or a function. In the embodiments configured as relational databases (e.g., such as Oracle® relational databases), the data objects can be configured as a table or column. Other configurations include specialized objects, distributed objects, object-oriented programming objects, and semantic web objects, for example. The data object models can be configured as an application programming interface for creating HyperText Markup Language (HTML) and Extensible Markup Language (XML) electronic documents. The models can be further configured as any of a tree, graph, container, list, map, queue, set, stack, and variations thereof. The data object files are created by compilers and assemblers and contain generated binary code and data for a source file. The database components can include any of tables, indexes, views, stored procedures, and triggers.

The processor 45 may comprise any of an integrated circuit, an application-specific integrated circuit (ASIC), field-programmable gate array (FPGA), a microcontroller, a microprocessor, an ASIC processor, a digital signal processor, a networking processor, a multi-core processor, or other suitable processors selected to be communicatively linked to the sensor. In some examples, the processor 45 may comprise a CPU of the system 10. In other examples the processor 45 may be a discrete component independent of other processing components in the system 10. In other examples, the processor 45 may be a microcontroller, hardware engine, hardware pipeline, and/or other hardware-enabled device suitable for receiving, processing, operating, and performing various functions required by the system 10. The processor 45 may be provided in the system 10 coupled to the system 10, or communicatively linked to the system 10 from a remote networked location, according to various examples.

The processing techniques performed by the processor 45 may be implemented as one or more software modules in a set of logic instructions stored in a machine or computer-readable storage medium such as random-access memory (RAM), read only memory (ROM), programmable ROM (PROM), firmware, flash memory, etc. in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof. For example, computer program code to carry out processing operations performed by the processor 45 may be written in any combination of one or more programming languages.

The processor 45 may include a central processing unit, microprocessors, hardware engines, and/or other hardware devices suitable for retrieval and execution of instructions stored in a machine-readable storage medium such that the processor 45 may fetch, decode, and execute computer-executable instructions to enable execution of locally-hosted or remotely-hosted applications for controlling action of the system 10. The remotely-hosted applications may be accessible on one or more remotely-located devices (not shown). For example, the remotely-located devices may be a computer, tablet, smartphone, or remote server. As an alternative or in addition to retrieving and executing instructions, processor 45 may include one or more electronic circuits including a number of electronic components for performing the functionality of one or more of the computer-executable instructions.

The machine-readable storage medium may be any electronic, magnetic, optical, or other physical storage device that stores executable instructions. Thus, the machine-readable storage medium may be, for example, Random Access Memory (RAM), an Electrically-Erasable Programmable Read-Only Memory (EPROM), volatile memory, non-volatile memory, flash memory, a storage drive (e.g., a hard drive), a solid-state drive, optical drive, any type of storage disc (e.g., a compact disc, a digital versatile disc (DVD), etc.), and the like, or a combination thereof. In one example, the machine-readable storage medium may include a non-transitory computer-readable storage medium. The machine-readable storage medium may be encoded with executable instructions for enabling execution of remotely-hosted applications accessed on the one or more remotely-located devices.

Figure 2:
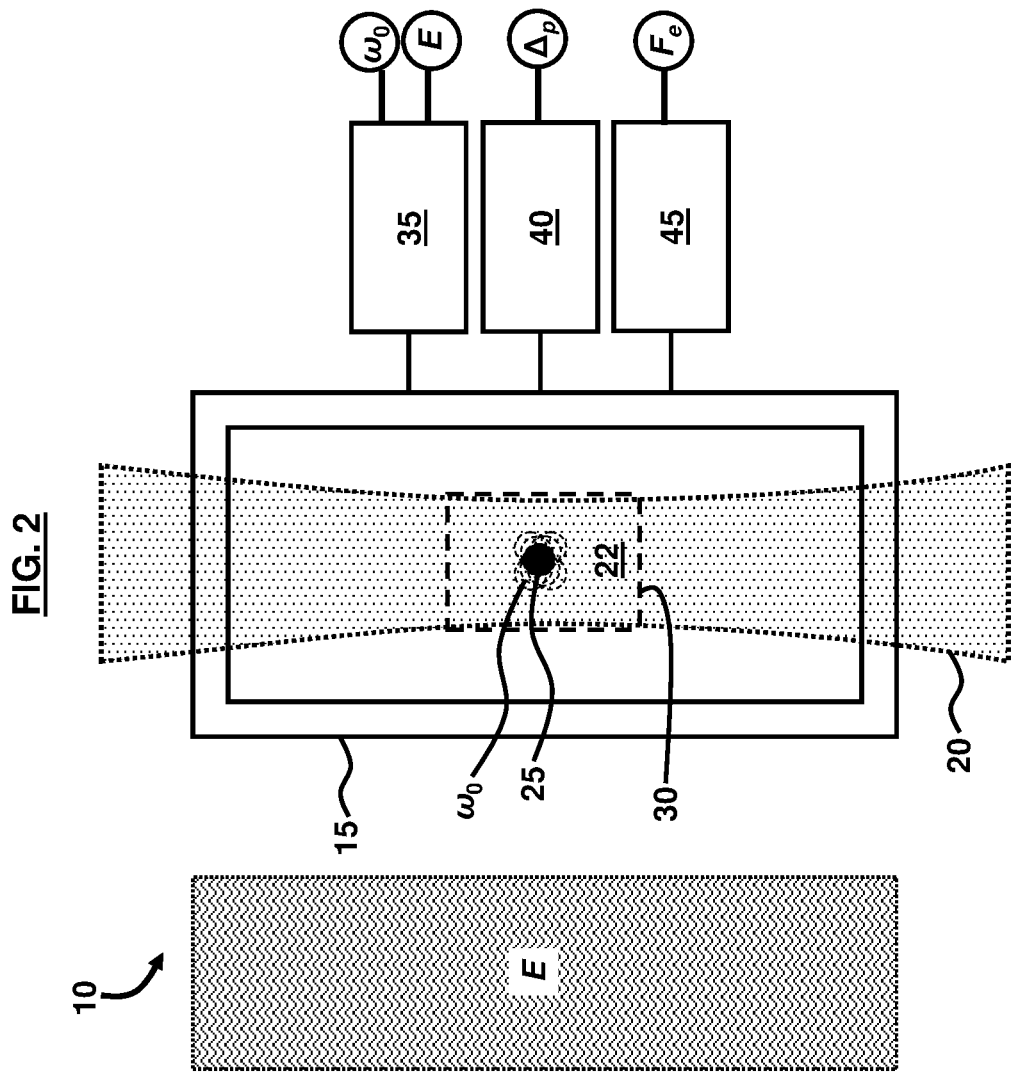
FIG. 2 is a schematic block diagram illustrating the system of FIG. 1 with a defined trap region, according to an embodiment herein.

FIG. 2, with reference to FIG. 1, illustrates an example in which the focus 30 of the laser beam 20 in the vacuum chamber 15 where the nanoparticle 25 oscillates at the trapping frequency $\omega_0$ defines a trap region 22 in the vacuum chamber 15. The nanoparticle 25 that is trapped in the trap region 22 is configured to constantly oscillate in the trap region 22 due to the trapping potential of the laser beam 20. In some examples, at least one lens (not shown) may be suitably positioned adjacent to the vacuum chamber 15 to direct the focus 30 of the laser beam 20 in the defined trap region 22 of the vacuum chamber 15. For example, the lens may comprise any of a convex lens, a concave lens, and a combination thereof arranged to direct the focus 30 of the laser beam 20 in the trap region 22 of the vacuum chamber 15. Furthermore, the lens may be made of any suitable material to permit the optical functionality required to sufficiently direct the focus 30 of the laser beam 20 in the trap region 22 of the vacuum chamber 15.

Figure 3:
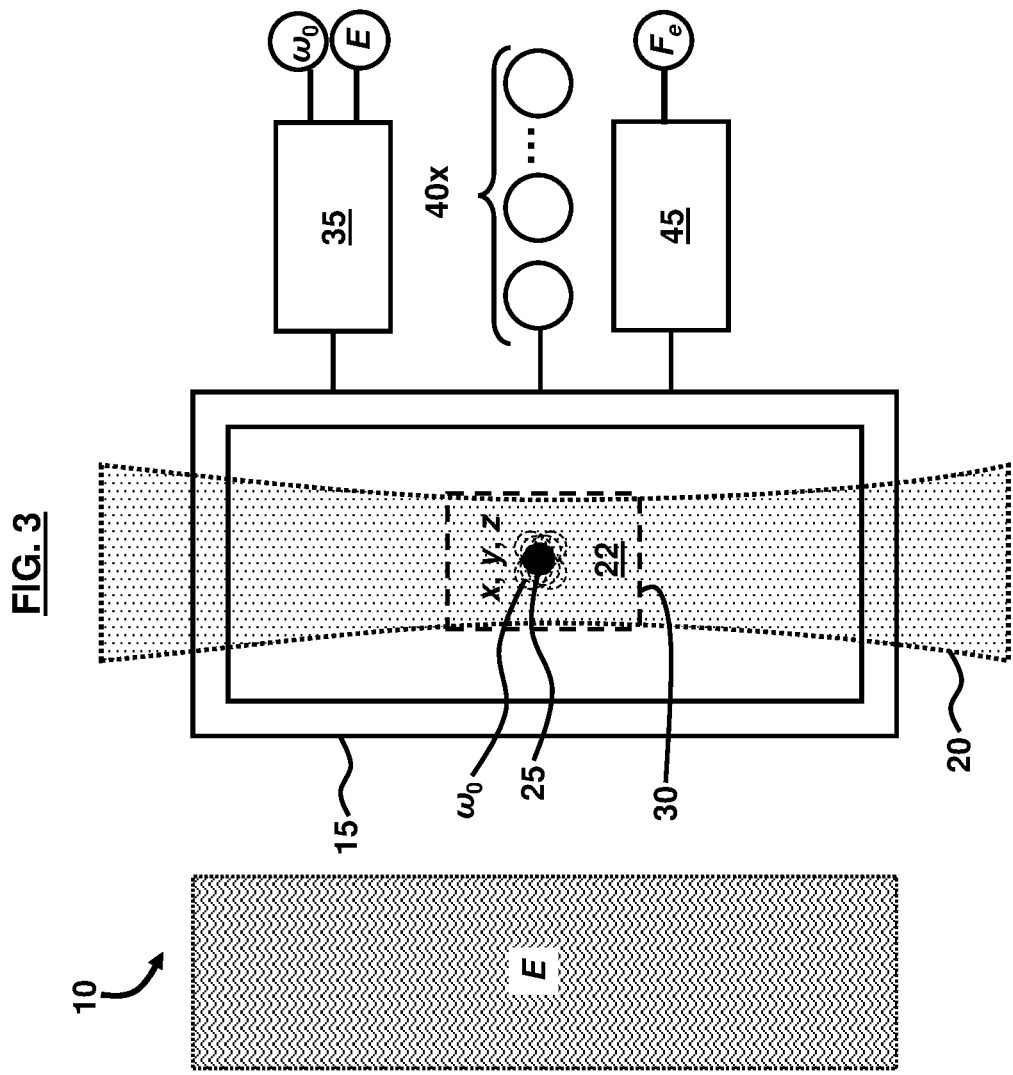
FIG. 3 is a schematic block diagram illustrating the system of FIG. 2 with a plurality of photodetectors, according to an embodiment herein.

FIG. 3, with reference to FIGS. 1 and 2, illustrates an example in which the detector 40 may comprise a plurality of photodetectors 40x that are spaced apart to identify spatial coordinates x, y, z of the oscillating nanoparticle 25 at the trapping frequency $\omega_0$. The plurality of photodetectors 40x may be positioned within the trapping laser beam 20 to measure the sum of the scattered and non-scattered light, which depends on the relative phases of the two. The phase of the non-scattered light is nominally constant, while the phase of the scattered light depends on the position (and thus, the spatial coordinates x, y, z) of the nanoparticle 25. Therefore, by measuring the relative phase of the two signals, the plurality of photodetectors 40x constantly measures the distance between itself and the nanoparticle 25. Accordingly, an array of the plurality of photodetectors 40x at different positions can track the changing position of the nanoparticle 25 in three-dimensions to identify the spatial coordinates x, y, z, and remove errors associated with fluctuations in the non-scattered light phase.

The processor 45 may calculate the electromagnetic force $F_e$ of the ambient electric field E based on the spatial coordinates x, y, z of the oscillating nanoparticle 25 at the trapping frequency $\omega_0$. Moreover, the processor 45 may identify the ambient electric field E based on the calculated electromagnetic force $F_e$ and the measured charge of the nanoparticle 25. In an example, the processor 45 may be pre-programmed with defined examples of various types of electric fields with associated electromagnetic forces. When the processor 45 calculates the electromagnetic force $F_e$, the processor 45 may then compare this value with the pre-programmed electromagnetic forces to identify the corresponding type of electric field. In other examples, the processor 45 may retrieve this information from a memory device (not shown) such as a cloud-based memory device. Furthermore, the processor 45 may continuously measure the ambient electric field E such that whenever an ambient electric field E is within a suitable vicinity of the vacuum chamber 15 to cause oscillation of the nanoparticle 25, the processor 45 may calculate the electromagnetic force $F_e$ to measure and identify the ambient electric field E.

The oscillation of the charged nanoparticle 25 that is subjected to the ambient electric field E may be damped. There are many effects which may cause the nanoparticle 25 to gain motional energy and, if left unchecked, oscillate with greater amplitude within the focus 30 of the laser beam 20 such as the amplitude and frequency of the ambient electric field E and its associated electromagnetic force $F_e$, on-resonant enhancement of the system 10 due to the oscillating nanoparticle 25 being in resonance with the ambient electric field E, vibrational motion of the laser beam 20, fluctuations in the intensity of the laser beam 20, collisions between the nanoparticle 25 and background gas within the vacuum chamber 15, the momentum kicks associated with the absorption and re-emission of photons of the nanoparticle 25 from the trapping laser beam 20, among other effects, according to some examples. Therefore, the oscillation of the nanoparticle 25 is damped. One way to accomplish this is using Sisyphus cooling, for example, which is a type of laser cooling involving shining laser beams on an atom sample. When the nanoparticle 25 moves toward its center of oscillation, the strength of the focus 30 of the laser beam 20 is decreased. This causes the nanoparticle 25 to gain less kinetic energy traveling toward its center of oscillation then it spent moving away from its center of oscillation. Thus, the nanoparticle 25 constantly loses motional energy. Eventually, some energy equilibrium is reached that depends on the characteristics of the heating effects and, in very low-energy cases, quantum mechanical limitations.

Figure 4:
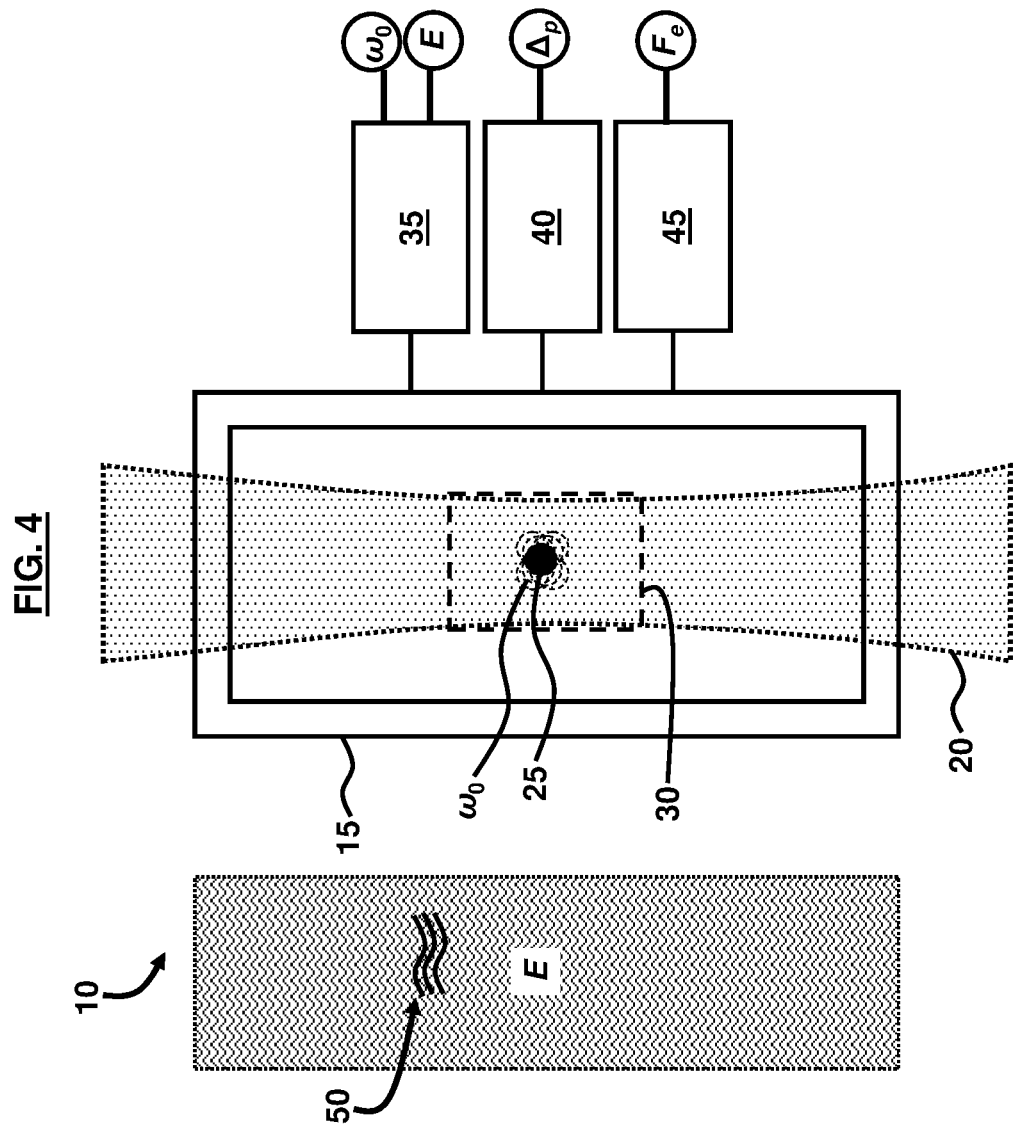
FIG. 4 is a schematic block diagram illustrating aspects of the electric field shown in the system of FIG. 1, according to an embodiment herein.

In some examples, the ambient electric field E may be static or dynamic, uniform or non-uniform, and/or electric or magnetic. Furthermore, the ambient electric field E may comprise low frequency electric fields or high frequency electric fields such as radio waves. In another example, the ambient electric field E may comprise X-rays. FIG. 4, with reference to FIGS. 1 through 3, illustrates an example in which the ambient electric field E may comprise a radio frequency wave 50 with a frequency of approximately 10 MHz to 300 GHz.

Figure 5:
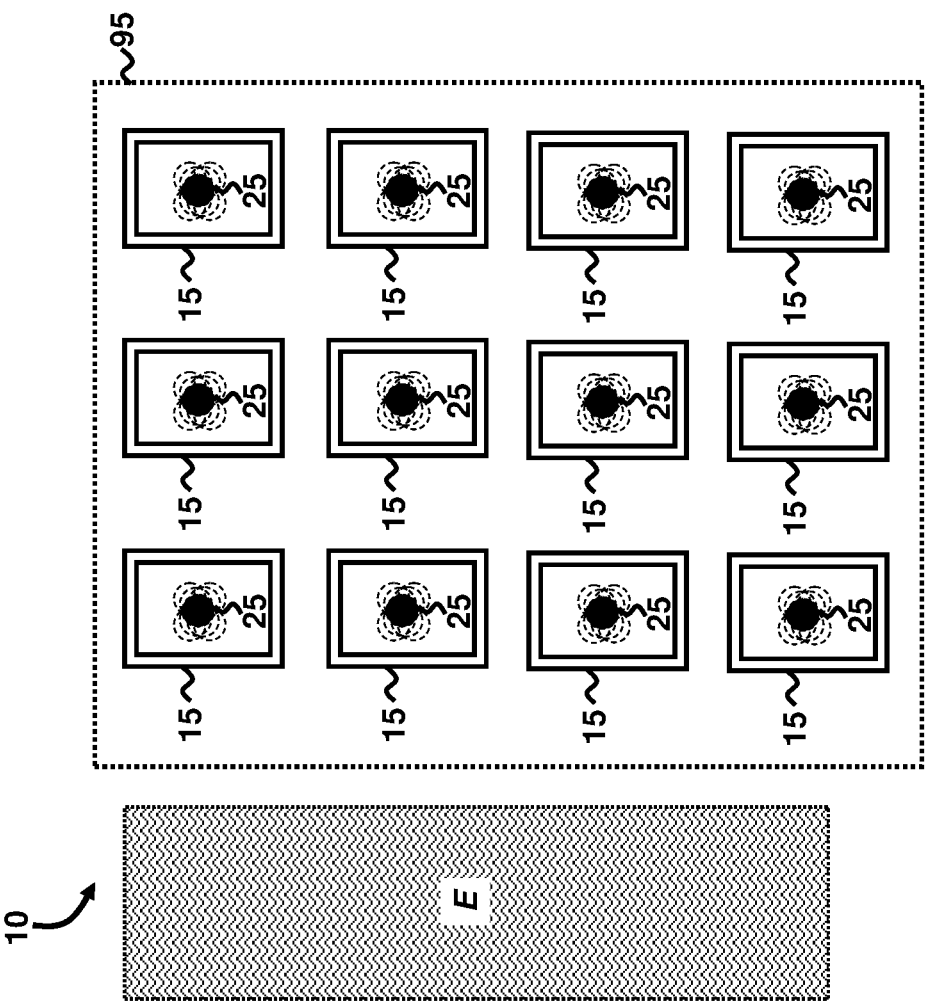
FIG. 5 is a schematic block diagram illustrating the system of FIG. 1 arranged in an array of vacuum chambers with respective nanoparticles, according to an embodiment herein.

FIG. 5, with reference to FIGS. 1 through 4, illustrates an example in which the system 10 may comprise an array 95 comprising a plurality of vacuum chambers 15 comprising respective oscillating nanoparticles 25. Accordingly, a technique can be implemented to arrange the array 95 to determine the precise electric field gradient by separating multiple sensors (i.e., each sensor defined as the vacuum chamber 15 containing an oscillating nanoparticle 25 and associated devices such as the controller 35, detector 40, and processor 45) and measuring the driving ambient electric field E at each sensor (i.e., each respective vacuum chamber 15 containing an oscillating nanoparticle 25 and associated devices such as the controller 35, detector 40, and processor 45).

Figure 6:
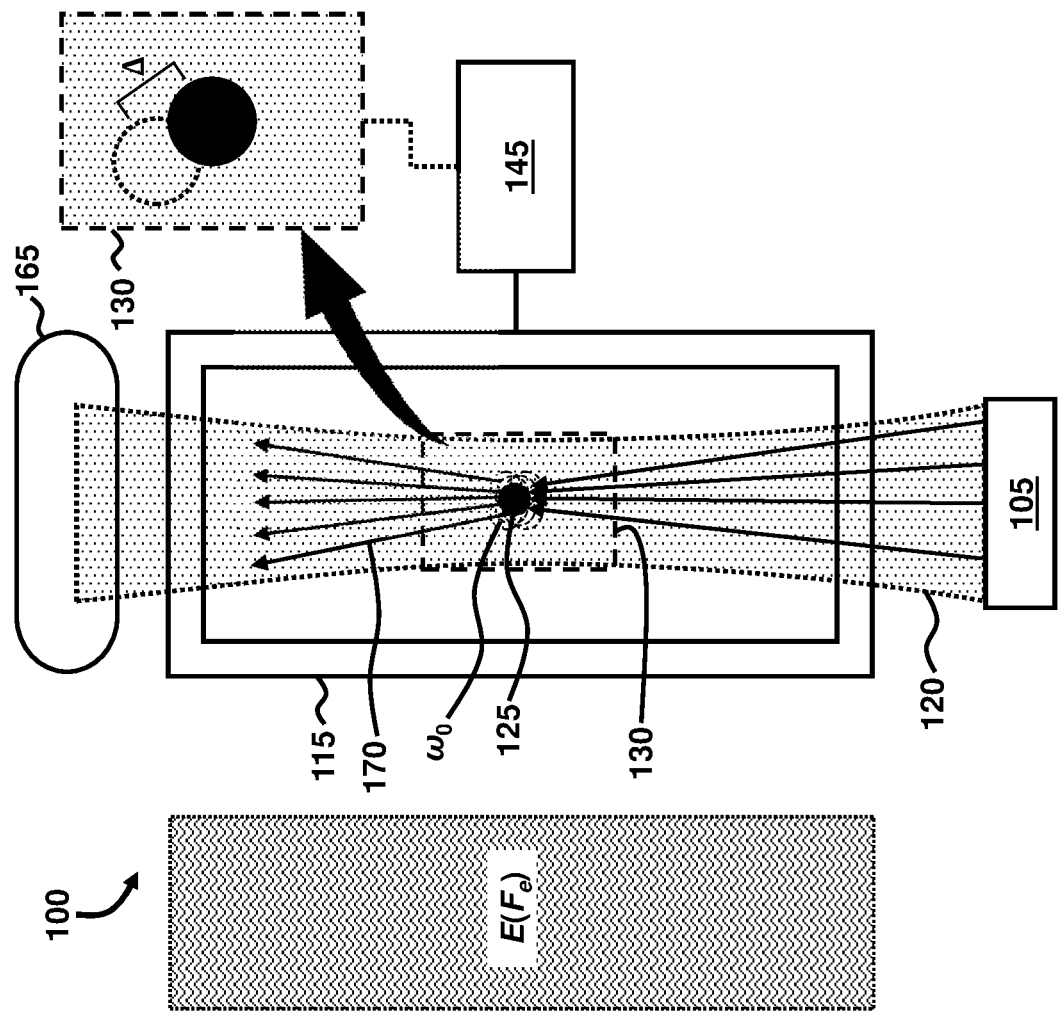
FIG. 6 is schematic block diagram illustrating a system to calculate an electromagnetic force of an electric field using the displacement of a nanoparticle, according to an embodiment herein.

FIG. 6, with reference to FIGS. 1 through 5, is a block diagram illustrating a system 100 comprising a laser source 105 to generate a laser beam 120. According to some examples, the laser beam 120 may comprise any suitable wavelength of light such as 532 nm, 1064 nm, and 1550 nm, although other suitable wavelengths may be utilized in accordance with the embodiments herein. A vacuum chamber 115 is provided comprising a levitating charged nanoparticle 125 oscillating at a trapping frequency $\omega_0$ in a focus 130 of the laser beam 120. In some non-limiting examples, the nanoparticle 125 may have one or two electron charges present. The nanoparticle 125 scatters light 170, and the nanoparticle 125 oscillates with higher amplitude indicating the presence of an electric field E outside of the vacuum chamber 115. In some examples, the electric field E may be static or dynamic, uniform or non-uniform, and/or electric or magnetic. Furthermore, the electric field E may comprise low frequency electric fields or high frequency electric fields such as radio waves. In another example, the electric field E may comprise X-rays.

In an example, the nanoparticle 125 may be a sub-wavelength-sized particle, although any suitably sized nanoparticle 125 may be used in accordance with the embodiments herein. In an example, the diameter of the nanoparticle 125 may be smaller than a wavelength of the laser beam 120, around 100-200 nm. In another example, the nanoparticle 125 may be a highly charged nanoparticle (i.e., q=±5) having a diameter of approximately 1-2 microns. The charged nanoparticle 125 may comprise various materials such as silica, silicon, or diamond, for example, and may have some non-zero polarizability and therefore is attracted to regions of higher electric field density; i.e. the center of the focus 130 of the laser beam 120. Thus, the nanoparticle 125 is "levitated", or held in space by the laser beam 120. As such, the laser beam 120 is focused to a point in space; e.g., the focus 130, in the vacuum chamber 115 in order to levitate the nanoparticle 125. Accordingly, the focus 130 may be considered as an optical dipole trap for holding the suspended nanoparticle 125 at the trapping frequency $\omega_0$. The nanoparticle 125 may be trapped by a single laser beam 120 regardless of any corresponding gravitational fields applied to the nanoparticle 125. The nanoparticle 125 may be smaller than the wavelength of light, and does not reflect light like microspheres, and instead the nanoparticle 125 is attracted to the focus 130 of the laser beam 120 by virtue of the polarizability of the nanoparticle 125. Furthermore, the vacuum chamber 115 is not restricted to a high vacuum environment so long as signals are not obscured and reductions in sensitivity are not reduced by collisions of the nanoparticle 125 with air molecules.

Some example techniques of electrically charging the nanoparticle 125 may include: (1) Directing electrons at the nanoparticle 125 from an electron gun or other electron source (not shown). (2) Hitting the nanoparticle 125 with light from a lamp, LED, laser, or other light source (not shown in FIG. 1) that causes the nanoparticle 125 to eject electrons. This happens when the energy of the photons in the light source is comparable to the work function of the material of the nanoparticle 125. (3) Bouncing electrons from an electron gun or other electron source off a piece of metal (not shown) adjacent to the nanoparticle 125 and directing the electrons to the nanoparticle 125. In an example, the piece of metal may comprise gold or any other suitable metal that deflects electrons. (4) Hitting a piece of metal adjacent to the nanoparticle 125 with light that causes the metal to emit electrons, and then directing the electrons to the nanoparticle 125. (5) Prior to ejecting the nanoparticle 125 into the vacuum chamber 115, the nanoparticle 125 can be attached to some type of surface (not shown). If the nanoparticle 125 and surface materials have different electron affinity, the nanoparticle 125 will have a natural tendency to be charged upon being ejected. If the surface is charged with electrons via any of the ways described above, or if the surface is charged via a voltage supply, some of that charge will spread to the nanoparticle 125 attached to that surface, causing the nanoparticle 125 to be charged upon ejection into the vacuum chamber 115. Furthermore, other suitable techniques of charging the nanoparticle 125 are possible, and the embodiments herein are not restricted to any particle technique and are not restricted to only one of the techniques described above.

In the context of the embodiments herein, the electric field E may be located anywhere outside the vacuum chamber 115 containing the nanoparticle 125 such that the distance or area containing the electric field E attempts to drive the nanoparticle 125 to oscillate at resonance with the electric field E. While the drawings depict the electric field E positioned at a particular region with respect to the vacuum chamber 115, this is merely for illustrative purposes only, and accordingly the electric field E may completely or partially surround the vacuum chamber 115. Furthermore, there are several factors that could affect the oscillation of the nanoparticle 125 including, for example, the type and strength of the electric field E, the size and/or type of nanoparticle 125, and the characteristics of the vacuum chamber 115 such as the material properties or thickness, etc.

At least one sensor 165 is provided to detect a position of the nanoparticle 125 as the nanoparticle 125 oscillates in the vacuum chamber 115. The at least one sensor 165 may comprise any of an electrical, chemical, mechanical, optical, or magnetic detector, or a combination thereof used to detect the position of the oscillating nanoparticle 125. In an example, the at least one sensor 165 may be positioned inside or outside the vacuum chamber 115 and may utilize image detection and processing techniques to detect and compare the changes in position of the nanoparticle 125 as the nanoparticle 125 oscillates in the vacuum chamber 115. Moreover, the nanoparticle 125 constantly scatters light from the trapping laser beam 120 in the form of spherical waves; i.e., photons traveling away from the nanoparticle 125 in random directions. Accordingly, the at least one sensor 165 may monitor the position of the nanoparticle 125 based on light emitted by the nanoparticle 125 as the nanoparticle 125 oscillates.

More specifically, the position of the nanoparticle 125 can be monitored quasi-continuously while in the vacuum chamber 115, for example, by monitoring the interference pattern between the trapping laser and the light scattered by the nanoparticle 125 or by monitoring the transmission of an optical cavity (not shown) surrounding the vacuum chamber 115. When a force $F_e$ acts on the nanoparticle 125 or the vacuum chamber 115, the nanoparticle 125 will move within the vacuum chamber 115. By detecting the position of the nanoparticle 125 by the at least one sensor 165 with respect to time, the force $F_e$ on the nanoparticle 125 can be calculated by a processor 145, as further described below. Industry-reported position sensitivities are on the order of $10^{-14}$ m/√Hz and force sensitivities are on the order of $10^{-20}$ N/√Hz. These results may be due to the relatively low amount of coupling between the trapped nanoparticle 125 and the environment (i.e., the high mechanical quality factor). To achieve such decoupling, the system 100 may be operated in high or ultra-high vacuum, according to an example.

A processor 145 is provided (i) to determine a displacement Δ in the position of the nanoparticle 125 as well as the trapping frequency $\omega_0$ while the nanoparticle 125 is oscillating in the focus 130 of the laser beam 120, and (ii) to calculate the electromagnetic force $F_e$ of the electric field E based on the frequency and amplitude of the motion of the nanoparticle 125. The processor 145 may be similarly configured as indicated with respect to the processor 45 described above. As the nanoparticle 125 oscillates in the focus 130 of the laser beam 120, the nanoparticle 125 moves (i.e., changes position), and thus the movement causes a displacement Δ in the position of the nanoparticle 125. The trapping frequency $\omega_0$ may be determined by the processor 145 as the frequency of the oscillating nanoparticle 125 once it becomes "trapped" or "levitated" in the focus 130 of the laser beam 120 in the vacuum chamber 115.

The processor 145 may identify the electric field E based on the calculated electromagnetic force $F_e$. In an example, the processor 145 may be pre-programmed with defined examples of various types of electric fields with associated electromagnetic forces. When the processor 145 calculates the electromagnetic force $F_e$, the processor 145 may then compare this value with the pre-programmed electromagnetic forces to identify the corresponding type of electric field. In other examples, the processor 145 may retrieve this information from a memory device (not shown) such as a cloud-based memory device. Furthermore, the processor 145 may continuously measure the electric field E such that whenever an electric field E is within a suitable vicinity of the vacuum chamber 115 to cause oscillation of the nanoparticle 125, the processor 145 may calculate the electromagnetic force $F_e$ to measure and identify the electric field E.

Figure 7:
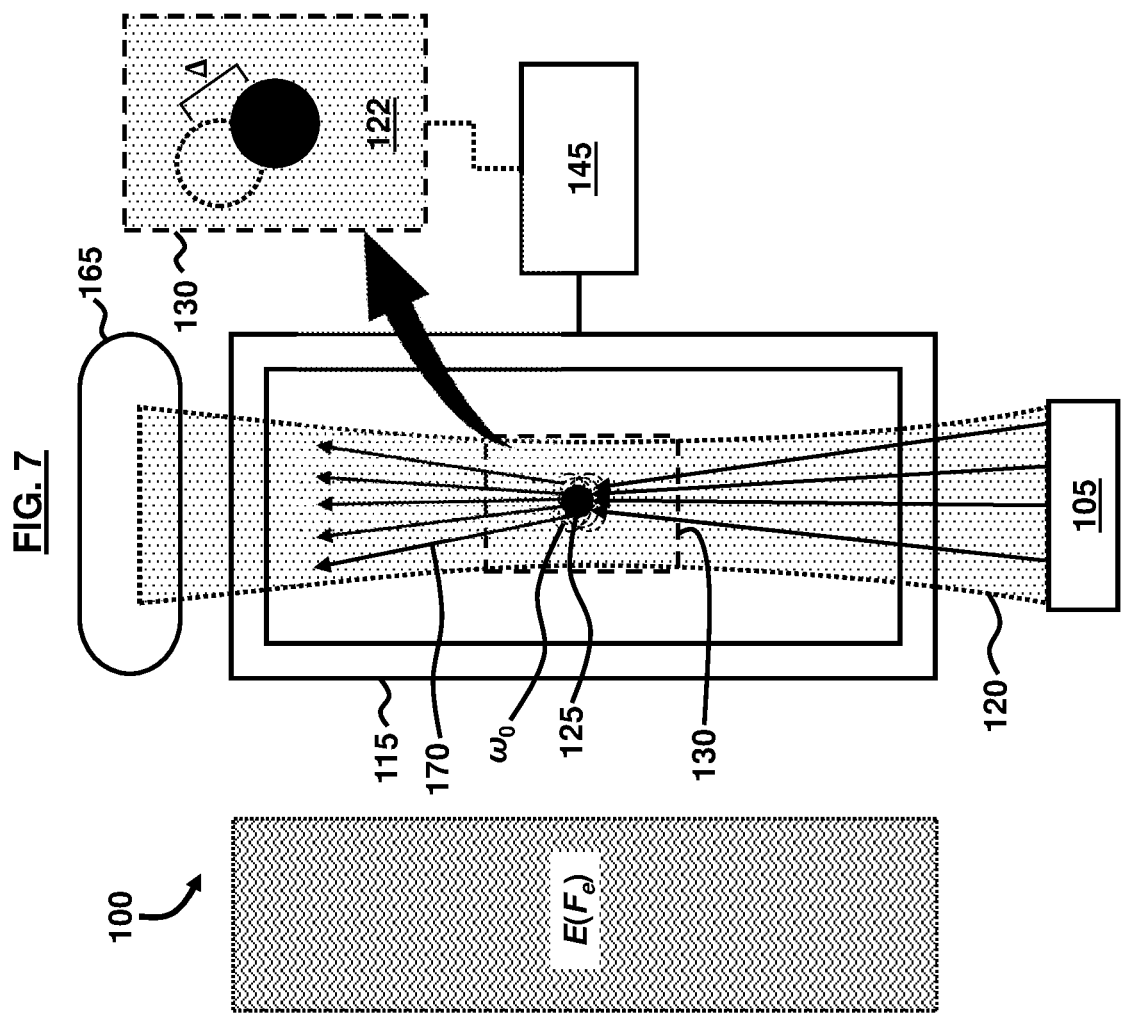
FIG. 7 is a schematic block diagram illustrating the system of FIG. 6 with a defined trap region, according to an embodiment herein.

FIG. 7, with reference to FIGS. 1 through 6, illustrates an example in which the focus 130 of the laser beam 120 in the vacuum chamber 115 where the nanoparticle 125 oscillates at the trapping frequency $\omega_0$ defines a trap region 122 in the vacuum chamber 115. The equation of motion for a charged nanoparticle 125 in the trap region 122 is given by:

$$\ddot{x}(t) + \Gamma_0 \dot{x}(t) + \frac{k}{m} x(t) = \frac{F_{ff}(t)}{m} + \frac{F_e}{m} e^{i\omega_{AC} t}$$

where x is the position, a dot signifies a derivative with respect to time, $F_0$ is the damping factor, k is the spring constant as determined by the gradient force of the trap region 122 of the vacuum chamber 115, m is the mass, $F_{ff}$ is the fluctuating forces, $F_e$ is the force from the electric field E, and $\omega_{AC}$ is the driving AC force. Using the well-known derivation outline given by Hempston, D., et al., "Force sensing with an optically levitated charged nanoparticle," Appl. Phys. Lett. Vol. 111, 133111, Sep. 28, 2017, pp. 1-4, incorporated herein by reference, the sensitivity floor for AC detection is then given by:

$$S_{AC}(\omega_{AC}) = \frac{1}{m^2} \frac{\lceil F_{ff}^2 \rceil + |F_{AC}^2|}{(\omega_0^2 - \omega_{AC}^2)^2 + (\Gamma_0 + \delta\Gamma)^2 \omega_{AC}^2}$$

An oscillating electric field of amplitude $F_e$ and frequency $\omega_{AC}$, such as that of radio-frequency transmissions, will drive the particle to oscillate at $\omega_{AC}$. When the trapping frequency $\omega_0$ is tuned to be in resonance with the ambient AC field; i.e., electric field E, the system 100 experiences on-resonant enhancement. This enhancement coupled with ultra-sensitive position detection leads to a small, sensitive transducer for very-low and low frequency electromagnetic detection. By sweeping the trap parameters such as laser power or beam waist, the trapping frequency $\omega_0$ can be tuned to sweep the trap region 122 into resonance with the electric field E. According to an example, the system 100 can scan over an extremely broad band of radio frequencies and measure the frequencies of RF transmission to high precision.

In order to measure the amplitude of the electric field E, the measured driving electromagnetic force $F_e$ is divided by the number of charges on the nanoparticle 125. A known number of charges can be added to the nanoparticle 125 as provided by the various techniques described above. To use a non-limiting example, an electromagnetic force $F_e$ at 75 kHz on a charged nanoparticle 125 with five electrons can be measured at a level of approximately $3 \times 10^{-20}$ N/Hz$^{1/2}$. Using the relation F=qE and assuming q is constant, δF=qδE. This yields an electric field sensitivity of 120 µV/cm/Hz$^{1/2}$. Using the techniques described above, and the arrangement of the overall system 100 as described herein, the embodiments herein may be able to reach approximately two orders of magnitude lower than the example calculated electric field sensitivity provided above.

Figure 8:
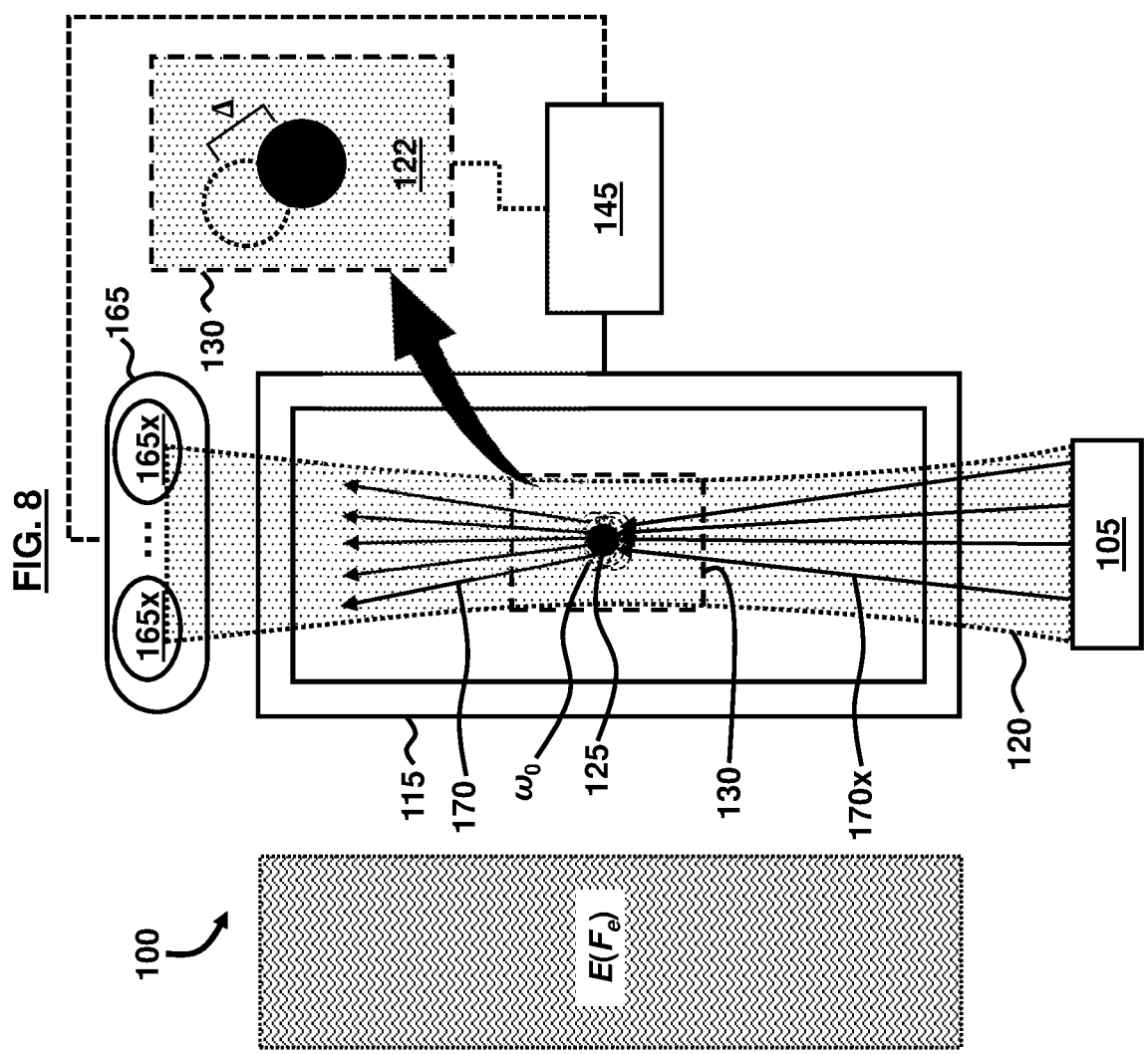
FIG. 8 is a schematic block diagram illustrating the system of FIG. 7 with an array of photodiode sensors, according to an embodiment herein.

FIG. 8, with reference to FIGS. 1 through 7, illustrates an example in which the at least one sensor 165 may comprise an array of photodiode sensors 165x to monitor an interference between scattered light 170 emitting from the nanoparticle 125 and light 170x from the laser beam 120 that is not scattered by the nanoparticle 125, and determine a three-dimensional motion of the nanoparticle 125 while the nanoparticle 125 is oscillating at the trapping frequency $\omega_0$ in the focus 130 of the laser beam 120. The array of photodiode sensors 165x may comprise any suitable type of photodiode device or devices capable of monitoring the scattered light 170, and accordingly, the array of photodiode sensors 165x may be arranged in any suitable arrangement to properly detect and monitor the scattered light 170. In an example, the array of photodiode sensors 165x may be communicatively coupled to the processor 145 to provide real-time image processing of the scattered light 170 by the processor 145.

Figure 9:
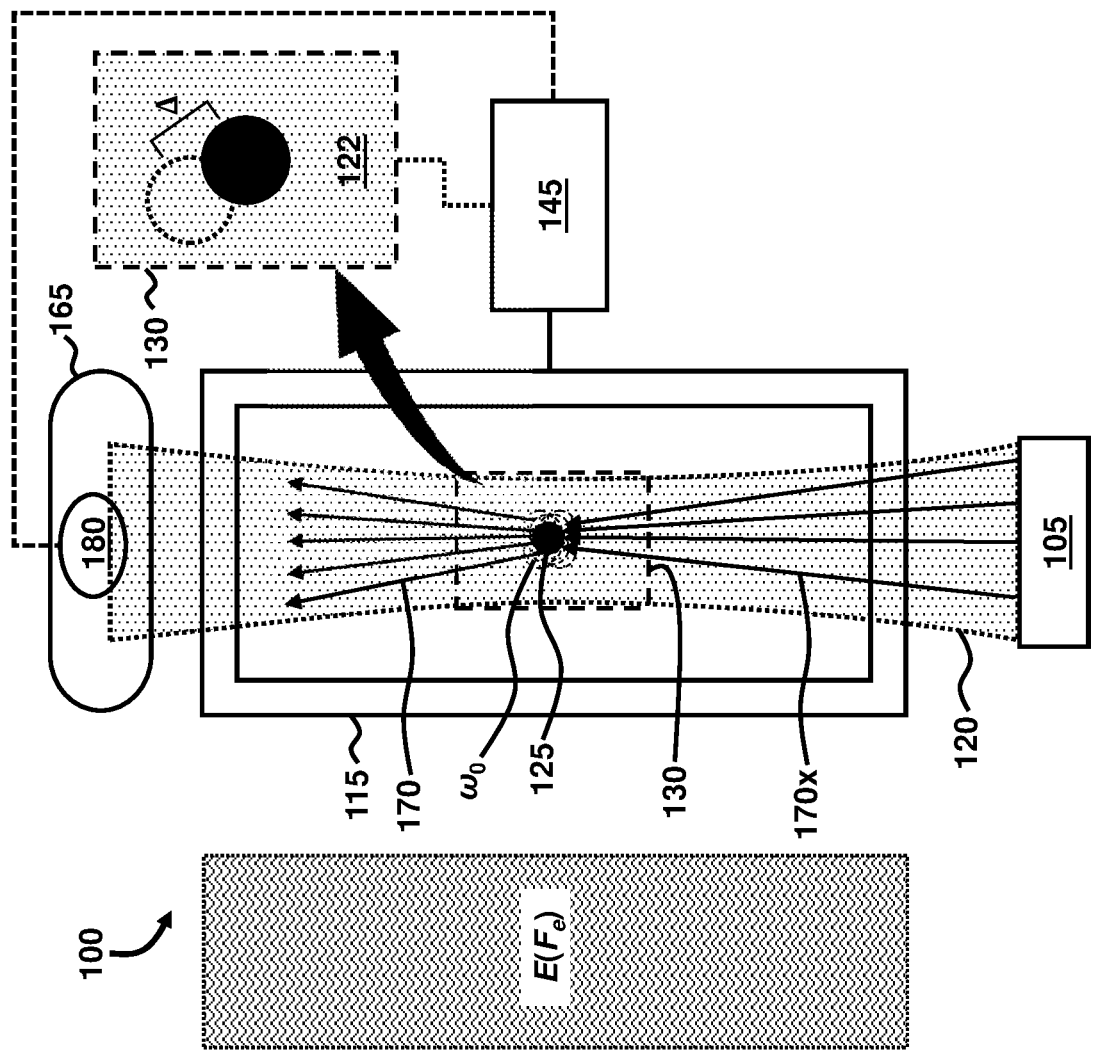
FIG. 9 is a schematic block diagram illustrating the system of FIG. 7 with an electric image sensor, according to an embodiment herein.

FIG. 9, with reference to FIGS. 1 through 8, illustrates an example in which the at least one sensor 165 may comprise an electric image sensor 180 to monitor the interference between the scattered light 170 emitting from the nanoparticle 125 and the light 170x from the laser beam 120 that is not scattered by the nanoparticle 125, and wherein the processor 145 is to determine a three-dimensional motion of the nanoparticle 125 while the nanoparticle 125 is oscillating at the trapping frequency $\omega_0$ in the focus 130 of the laser beam 120 based on the monitored scattered light 170. The electric image sensor 180 may comprise any suitable type of image sensing device or an array of devices capable of sensing the scattered light 170, and accordingly, the electric image sensor 180 may be positioned in any suitable position to properly sense the scattered light 170. In an example, the electric image sensor 180 may be communicatively coupled to the processor 145 to provide real-time image processing of the scattered light 170 by the processor 145.

FIG. 10A, with reference to FIGS. 1 through 9, illustrates an example in which the electric image sensor 180 may comprise a charge-coupled device (CCD) 181. In various examples, the CCD 181 may comprise any of a full-frame, frame-transfer, and interline device. In other examples, the CCD 181 may comprise any of an intensified CCD or an electron-multiplying CCD. Accordingly, the CCD 181 may comprise any suitable type of CCD or an array of CCDs capable of capturing images of the scattered light 170, and accordingly, the CCD 181 may be positioned in any suitable position to properly capture images of the scattered light 170. In an example, the CCD 181 may be communicatively coupled to the processor 145 to provide real-time image processing of the scattered light 170 by the processor 145.

Figure 10B:
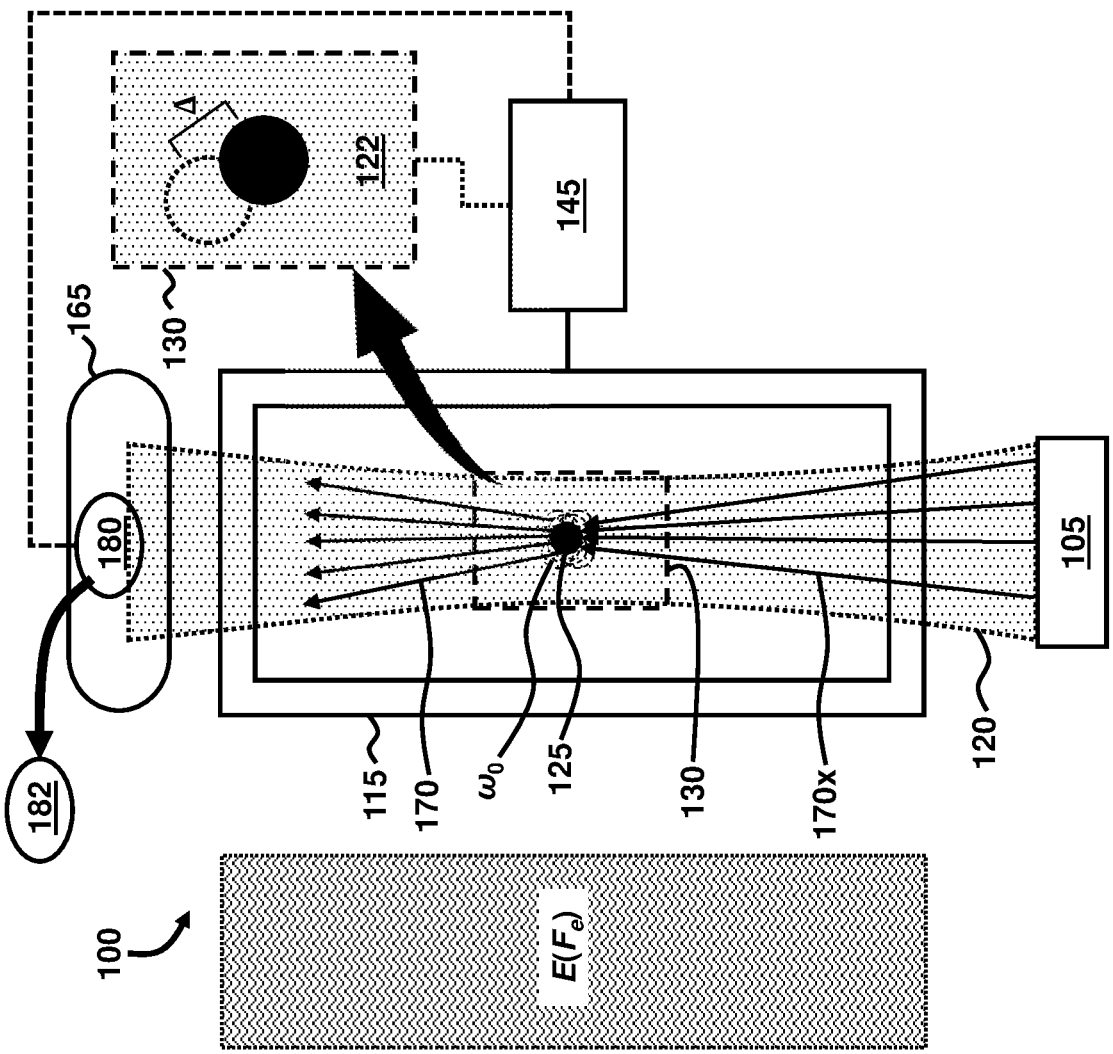
FIG. 10B is a schematic block diagram illustrating the system of FIG. 9 with a complementary metal-oxide-semiconductor (CMOS) camera, according to an embodiment herein.

FIG. 10B, with reference to FIGS. 1 through 10A, illustrates an example in which the electric image sensor 180 may comprise a complementary metal-oxide-semiconductor (CMOS) camera 182. In various examples, the CMOS camera 182 may comprise any of a passive-pixel CMOS camera and an active-pixel CMOS camera. Accordingly, the CMOS camera 182 may comprise any suitable type of CMOS sensor or camera or an array of CMOS sensors or cameras capable of capturing images of the scattered light 170, and accordingly, the CMOS camera 182 may be positioned in any suitable position to properly capture images of the scattered light 170. In an example, the CMOS camera 182 may be communicatively coupled to the processor 145 to provide real-time image processing of the scattered light 170 by the processor 145.

Figure 11:
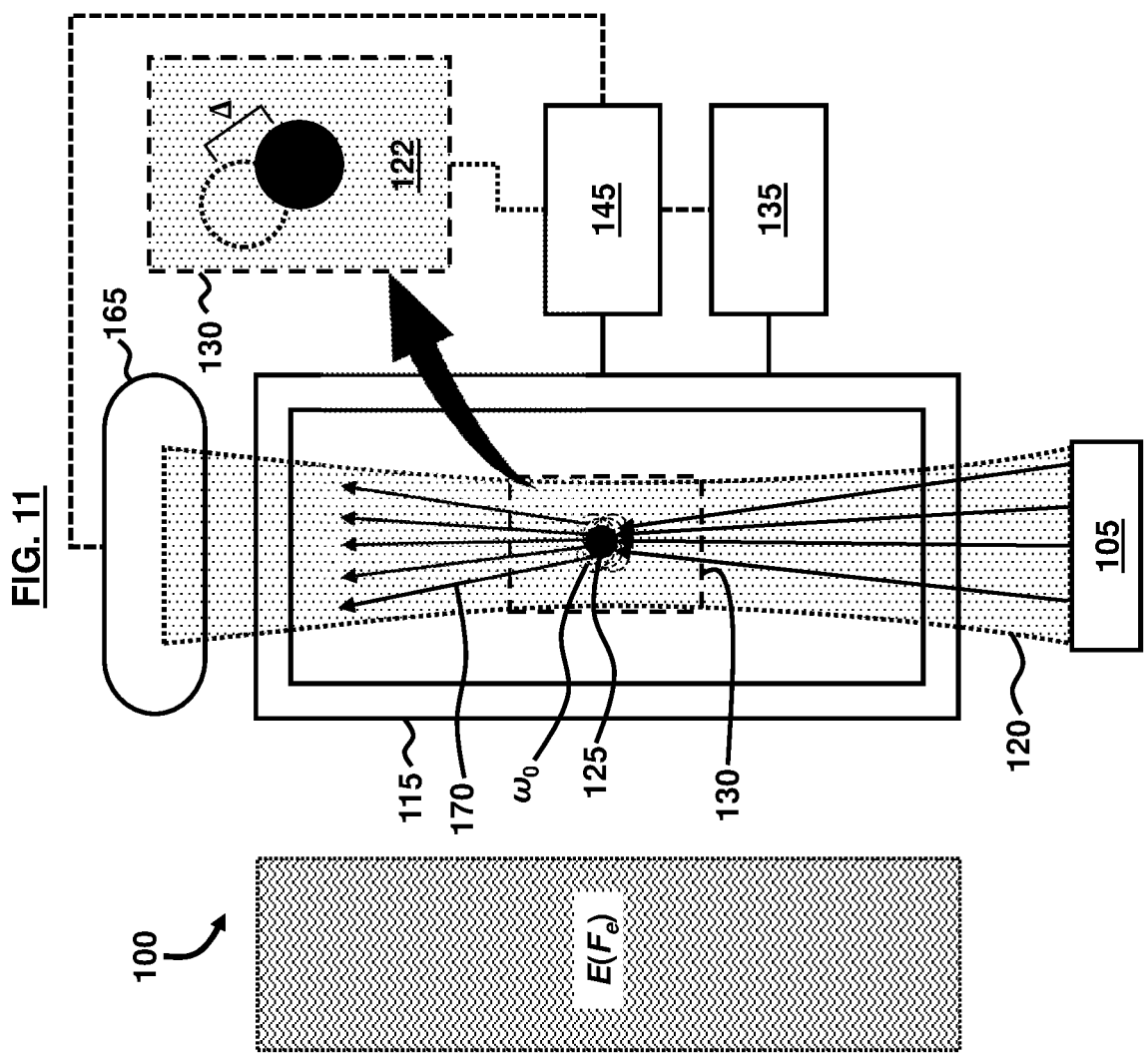
FIG. 11 is a schematic block diagram illustrating the system of FIG. 7 with a controller, according to an embodiment herein.

FIG. 11, with reference to FIGS. 1 through 10B, illustrates an example in which the system 100 may comprise a controller 135 to tune the trapping frequency $\omega_0$ of the nanoparticle 125 to be in resonance with the electric field E. In some examples, the controller 135 may comprise any of an electrical, mechanical, optical, magnetic, or atomic devices that control the trapping frequency $\omega_0$ of the oscillating nanoparticle 125. For example, the controller 135 may comprise an oscillator to adjust the trapping frequency $\omega_0$ of the oscillating nanoparticle 125 such that when the controller 135 detects resonance of the trapping frequency $\omega_0$ of the oscillating nanoparticle 125 with the frequency of the electric field E, then the system 100 may detect the signal characteristics of the electric field E, which may otherwise go undetected absent the on-resonant enhancement of the system 100. In an example, the controller 135 may be communicatively coupled to the processor 145.

Figure 12:
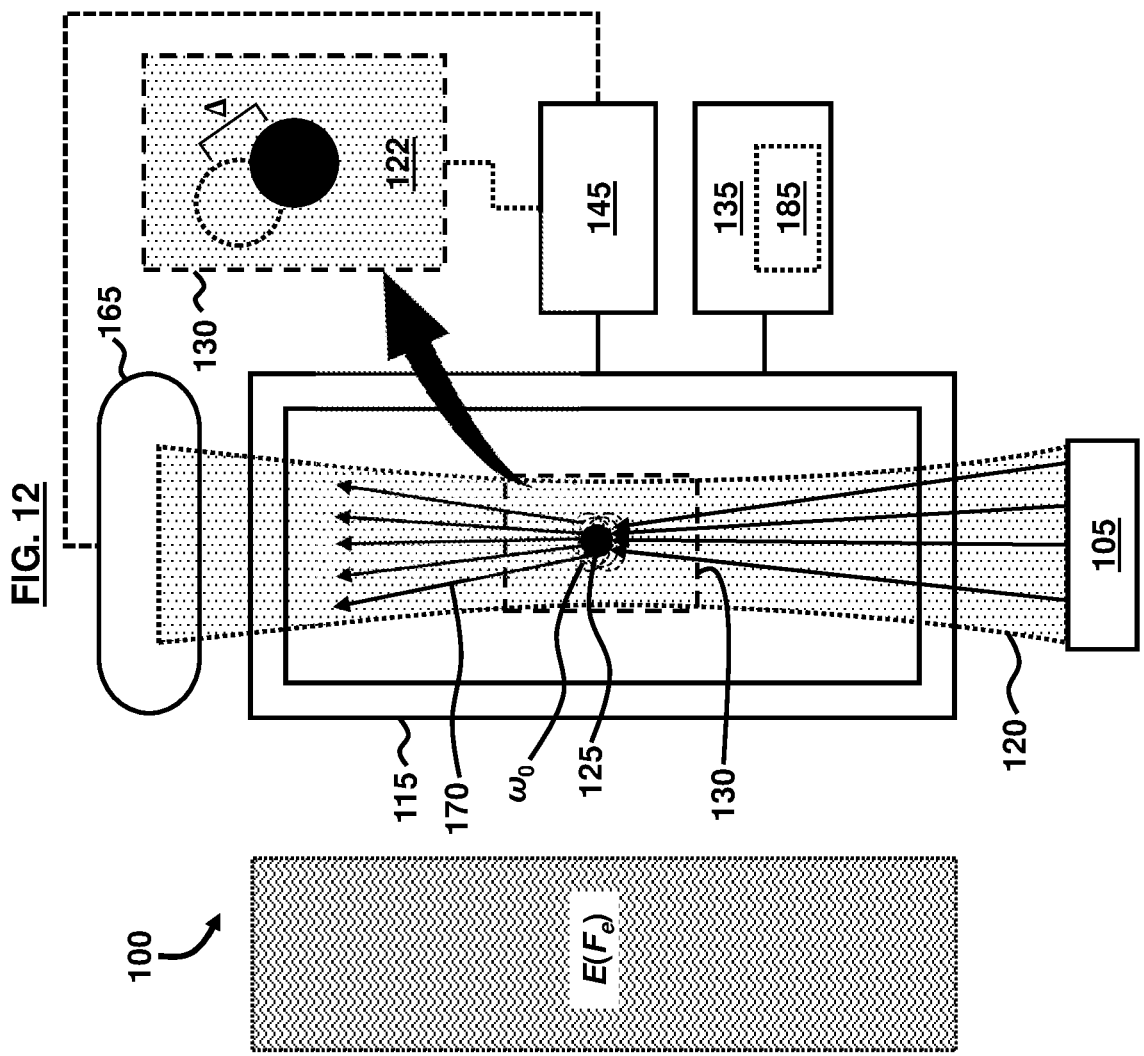
FIG. 12 is a schematic block diagram illustrating the system of FIG. 11 with a modulator, according to an embodiment herein.

FIG. 12, with reference to FIGS. 1 through 11, illustrates an example in which the controller 135 may comprise a modulator 185 to control an intensity of the laser beam 120 to tune the trapping frequency $\omega_0$. According to some examples, the modulator 185 may be a stand-alone device to modulate or control the intensity of the laser beam 120, or the modulator 185 may be configured as part of the controller 135 or the laser source 105 emitting the laser beam 20. Furthermore, the modulator 185 may provide for a "cooling" technique to help control (i.e., lower) the speed of the nanoparticle 125 upon entering the vacuum chamber 115.

FIG. 13, with reference to FIGS. 1 through 12, illustrates an example in which the system 100 may comprise an array 195 comprising a plurality of vacuum chambers 115 comprising respective oscillating nanoparticles 125. Accordingly, a technique can be implemented to arrange the array 195 to determine the precise electric field gradient by separating multiple sensors (i.e., each sensor defined as the vacuum chamber 115 containing an oscillating nanoparticle 125 and associated devices such as the controller 135, processor 145, and at least one sensor 165) and measuring the driving electric field E at each sensor (i.e., each respective vacuum chamber 115 containing an oscillating nanoparticle 125 and associated devices such as the controller 135, processor 145, and at least one sensor 165).

FIG. 14A, with reference to FIGS. 1 through 13, is a flow diagram illustrating a method 200 of identifying an electric field E. According to the method 200, block 205 provides focusing a laser beam 20, 120 in a vacuum chamber 15, 115 to define a trap region 22, 122 in the vacuum chamber 15, 115. In some examples, the laser beam 20, 120 may comprise any suitable wavelength of light such as 532 nm, 1064 nm, and 1550 nm, although other suitable wavelengths may be utilized in accordance with the embodiments herein.

Block 210 of method 200 provides introducing a charged nanoparticle 25, 125 into the trap region 22, 122. The nanoparticle 25, 125 may comprise any suitable material and size as described above. Moreover, the vacuum chamber 15, 115 may have any suitable size, shape, configuration, and material properties suitable to house a charged nanoparticle 25, 125 and to receive the laser beam 20, 120. According to some examples, the nanoparticle 25, 125 may be introduced using various techniques such as a spray aerosol technique, inert gas application, vibrational release.

Block 215 of method 200 provides introducing an electric field E proximate to the vacuum chamber 15, 115. In the context of the embodiments herein, the term "proximate" as it refers to the electric field E in relation to the vacuum chamber 15, 115 containing the nanoparticle 25, 125, respectively, may be defined as any distance or area containing the electric field E that generates an electromagnetic force $F_e$ that attempts to drive the nanoparticle 25, 125 to oscillate at resonance with the electric field E. The introduction of the electric field E may occur by transporting the system 10, 100 in any environment where an electric field E may be present. In this regard, the system 10, 100 may be portable for positioning in various locations, terrains, and environments including both indoor and outdoor environments.

Block 220 of method 200 provides detecting positions of the nanoparticle 25, 125 as the nanoparticle 25, 125 oscillates at a trapping frequency $\omega_0$ in the trap region 22, 122. The embodiments herein are not restricted to any particular type of detecting process so long as the positions of the nanoparticle 25, 125 can be accurately measured. For example, image processing techniques performed by the processor 45, 145 in conjunction with a detector 40 or at least one sensor 165, etc. may be utilized for the detecting process, as described above. Moreover, according to an example, the positions of the nanoparticle 25, 125 may be determined by measuring changes in the spatial coordinates x, y, z of the oscillating nanoparticle 25 at the trapping frequency $\omega_0$.

Block 225 of method 200 provides calculating the electric field E applied to the nanoparticle 25, 125 based on the detected positions and the trapping frequency $\omega_0$ of the nanoparticle 25, 125. According to some examples, the processor 45, 145 may perform the calculations in real-time and a feedback mechanism such as modulator 185 or other suitable device, may be utilized to change the intensity of the laser beam 20, 120 to ensure proper positioning of the nanoparticle 25, 125 in the trap region 22, 122 of the vacuum chamber 15, 115.

Block 230 of method 200 provides calculating an electromagnetic force $F_e$ of the electric field E based on the positional changes $\Delta_p$ (or displacement $\Delta$) of the nanoparticle 25, 125, respectively. As the nanoparticle 25, 125 oscillates in the focus 30, 130 of the laser beam 20, 120, the nanoparticle 25, 125 moves resulting in positional changes $\Delta_p$ of the nanoparticle 25, 125, and thus the movement causes a displacement $\Delta$ in the position (i.e., spatial coordinates x, y, z) of the nanoparticle 25, 125. According to some examples, the processor 45, 145 may perform the calculations of the electromagnetic force $F_e$ in real-time and continuously while the electric field E causes the nanoparticle 25, 125 to oscillate.

Figure 14B:
FIG. 14B is a flow diagram illustrating a method of quantizing an electric charge applied to a nanoparticle, according to an embodiment herein.

FIG. 14B, with reference to FIGS. 1 through 14A, is a flow diagram illustrating that the method 200 may comprise, in block 235, quantizing an electric charge applied to the nanoparticle 25, 125. In order to make the trapped nanoparticle 25, 125 highly sensitive to the electromagnetic force $F_e$, an electric charge can be added to the nanoparticle 25, 125 in discrete, controllable amounts using any of the techniques described above, among others. This may be useful as the amount of charge is quantized, meaning there can be integer values of charge on the nanoparticle 25, 125 resulting in a total charge that can be exactly known.

Figure 14C:
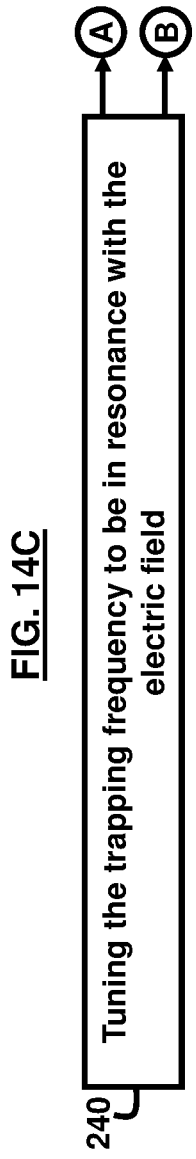
FIG. 14C is a flow diagram illustrating a method of controlling a trapping frequency of an oscillating nanoparticle, according to an embodiment herein.

FIG. 14C, with reference to FIGS. 1 through 14B, is a flow diagram illustrating that the method 200 may comprise, in block 240, tuning the trapping frequency $\omega_0$ to be in resonance with the electric field E. There are various techniques that can be utilized for tuning the trapping frequency $\omega_0$ to be in resonance with the electric field E, as further described below. However, the embodiments herein are not restricted to the below-described tuning techniques, and as such other techniques for tuning the trapping frequency $\omega_0$ to be in resonance with the electric field E may be utilized.

Figure 14D:
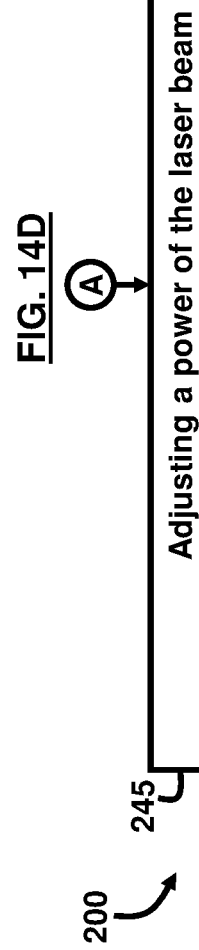
FIG. 14D is a flow diagram illustrating a first method of tuning the trapping frequency of an oscillating nanoparticle, according to an embodiment herein.

FIG. 14D, with reference to FIGS. 1 through 14C, is a flow diagram illustrating that the tuning of the trapping frequency $\omega_0$ may comprise, in block 245, adjusting a power of the laser beam 20, 120. Accordingly, the source of the laser beam 20, 120, such as the laser source 105, may be adjustable to increase or decrease the power of the laser beam 20, 120. Furthermore, additional laser beams may be directed at the nanoparticle 25, 125 to increase the overall power of the laser beam 20, 120 applied to the nanoparticle 25, 125.

Figure 14E:
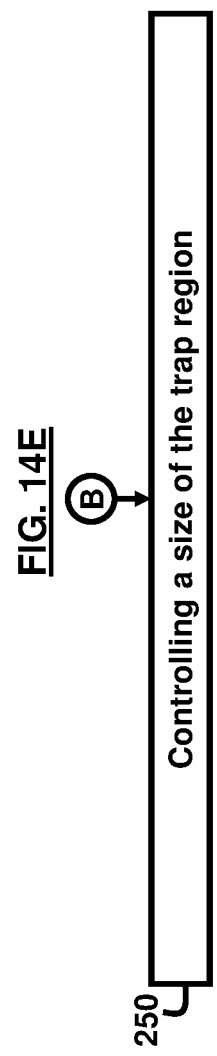
FIG. 14E is a flow diagram illustrating a second method of tuning the trapping frequency of an oscillating nanoparticle, according to an embodiment herein.

FIG. 14E, with reference to FIGS. 1 through 14D, is a flow diagram illustrating that the tuning of the trapping frequency $\omega_0$ may comprise, in block 250, controlling a size of the trap region 22, 122. In some examples, the size of the trap region 22, 122 may be controlled based on the characteristics of the vacuum chamber 15, 115 and qualities and parameters of the laser beam 20, 120. The size of the trap region 22, 122 may be further controlled based on the size of the nanoparticle 25, 125, for example. However, in this regard, there are no quantities such as the mass of the nanoparticle 25 or the size of the optical trap region 22, 122 which, if not known with high accuracy, would limit the overall accuracy of the system 10, 100 or practicing the method 200.

Figure 14F:
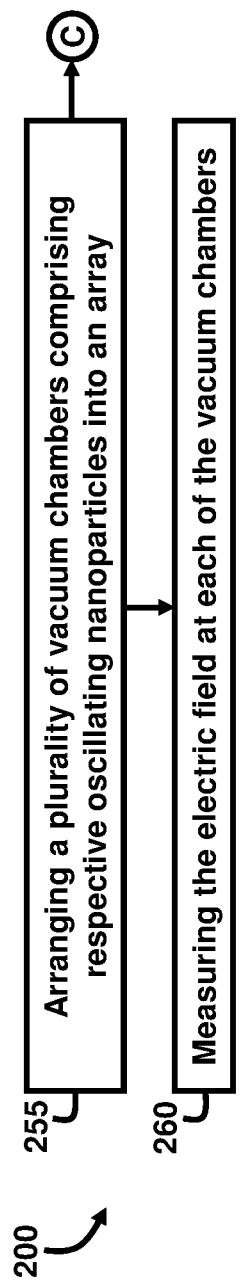
FIG. 14F is a flow diagram illustrating a method of measuring an electric field, according to an embodiment herein.

FIG. 14F, with reference to FIGS. 1 through 14E, is a flow diagram illustrating that the method 200 may comprise, in block 255, arranging a plurality of vacuum chambers 15, 115 comprising respective oscillating nanoparticles 25, 125 into an array 95, 195. Accordingly, method 200 can be practiced by arranging the array 95, 195 to determine the precise electric field gradient by separating multiple sensors and measuring the driving electric field E at each sensor. The method 200 may further comprise, in block 260, measuring the electric field E at each of the vacuum chambers 15, 115. The processor 45, 145 may be utilized to measure the electric field E at each of the vacuum chambers 15, 115 such that each vacuum chamber 15, 115 in the array 95, 195, respectively, may comprise its own separate processor 45, 145, respectively, in an example. According to another example, each array 95, 195 may comprise a single centralized processor 45, 145 that is communicatively linked to each of the vacuum chambers 15, 115 of the array 95, 195, respectively. In this regard, the processor 45, 145 may be remotely located from the vacuum chambers 15, 115 of the array 95, 195.

Figure 14G:
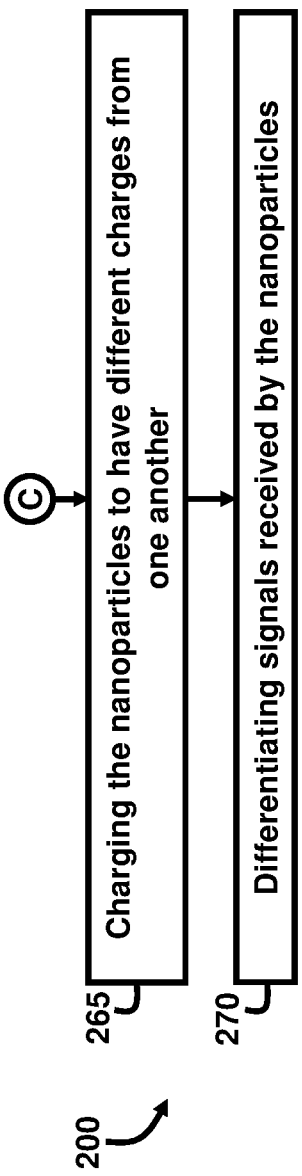
FIG. 14G is a flow diagram illustrating a method of differentiating signals received by a nanoparticle, according to an embodiment herein.

FIG. 14G, with reference to FIGS. 1 through 14F, is a flow diagram illustrating that the method 200 may comprise, in block 265, charging the nanoparticles 25, 125 to have different charges from one another. The method 200 may further comprise, in block 270, differentiating signals received by the nanoparticles 25, 125. In this regard, the different oscillating nanoparticles 25, 125 in each of the different vacuum chambers 15, 115 may have different electrical charges from each other. When the different oscillating nanoparticles 25, 125 have different electrical charges, the different oscillating nanoparticles 25, 125 will respond differently to the electric field E being detected. In such a case, it is possible to differentiate signal from noise. In this regard, reducing the noise increases the overall sensitivity to weaker signals, and thus allows the system 10, 100 and the method 200 to detect even a weak electric field E.

Figure 14H:
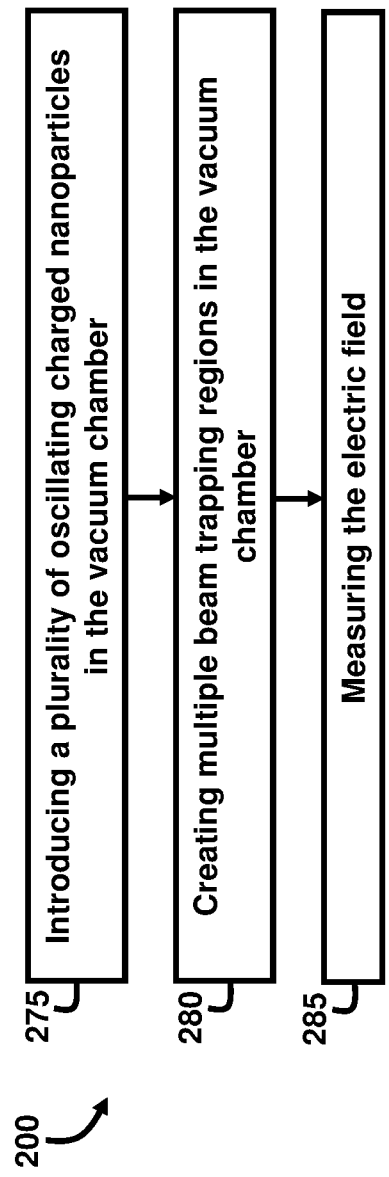
FIG. 14H is a flow diagram illustrating a method of measuring an electric field using multiple beam trap regions, according to an embodiment herein.

FIG. 14H, with reference to FIGS. 1 through 14G, is a flow diagram illustrating that the method 200 may comprise, in block 275, introducing a plurality of oscillating charged nanoparticles 25, 125 in the vacuum chamber 15, 115. The method 200 may further comprise, in block 280, creating multiple beam trap regions 22, 122 in the vacuum chamber 15, 115. Each beam trap region 22, 122 comprises a charged nanoparticle 25, 125. The method 200 may further comprise, in block 285, measuring the electric field E. This technique is similar to creating the array 95, 195 described above. However, instead of having multiple vacuum chambers 15, 115 in the array 95, 195, there is a single vacuum chamber 15, 115 containing multiple nanoparticles 25, 125 with multiple beam trap regions 22, 122 by directing the laser beam 20, 120 to the multiple nanoparticles 25, 125 or by driving multiple laser beams 20, 120 to the respective multiple nanoparticles 25, 125.

According to some examples, the embodiments herein utilize charged, optically levitated, charged nanoparticles 25, 125 held in the center of the focus 30, 130 of a laser beam 20, 120 by virtue of its polarizability, to measure DC and AC electric forces (i.e., electromagnetic force $F_e$). The trap region 22, 122 of the vacuum chamber 15, 115 causes the nanoparticle 25, 125 to oscillate at the trapping frequency $\omega_0$, and that trapping frequency $\omega_0$ may due to the properties of the nanoparticle 25, 125, the trap region 22, 122, the laser beam 20, 120, and/or the vacuum chamber 15, 115. The electric field E, which oscillates with some frequency co, attempts to drive the nanoparticle 25, 125 to oscillate at co. The system 10, 100 and method 200 may tune coo to be equal to co, in which case the electric field E drives resonant oscillations of the nanoparticle 25, 125; i.e., the nanoparticle 25, 125 oscillates with a higher amplitude, indicating the presence of the electric field E, which allows the processor 45, 145 to measure the frequency and amplitude of the electric field E, thereby identifying the electric field E. In particular, the embodiments herein utilize these charged nanoparticles 25, 125 as transducers for precisely measuring RF fields. Furthermore, according to various examples, the embodiments herein may be utilized in a wide variety of applications including military and commercial electronic communications, interception of adversary electronic communications, tunnel detection, and rescue efforts in collapsed building, mines, and recovery scenarios.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. A system comprising:
   a vacuum chamber to receive a laser beam and a charged nanoparticle, wherein the nanoparticle oscillates at a trapping frequency in a focus of the laser beam, and wherein resonant oscillation of the nanoparticle is driven by a presence of an ambient electric field adjacent to the vacuum chamber;
   a controller to tune the trapping frequency of an oscillating nanoparticle to be in resonance with the ambient electric field causing on-resonant enhancement of the system;
   a detector to detect positional changes of the oscillating nanoparticle; and
   a processor to calculate an electromagnetic force of the ambient electric field based on the positional changes of the oscillating nanoparticle.

2. The system of claim 1, wherein the detector comprises a plurality of photodetectors that are spaced apart to identify spatial coordinates of the oscillating nanoparticle at the trapping frequency.

3. The system of claim 2, wherein the processor calculates the electromagnetic force of the ambient electric field based on changes in the spatial coordinates of the oscillating nanoparticle at the trapping frequency.

4. The system of claim 1, wherein the processor identifies the ambient electric field based on the calculated electromagnetic force.

5. The system of claim 1, wherein the processor continuously measures the ambient electric field.

6. The system of claim 1, wherein the ambient electric field comprises a radio frequency wave.

7. A system comprising:
   a laser source to generate a laser beam;
   a vacuum chamber comprising a levitating charged nanoparticle oscillating at a trapping frequency in a focus of the laser beam, wherein the nanoparticle scatters light, and wherein resonant oscillation of the nanoparticle is driven by a presence of an electric field outside of the vacuum chamber;
   at least one sensor to detect a position of the nanoparticle; and
   a processor (i) to determine a displacement in the position of the nanoparticle as well as the trapping frequency while the nanoparticle is oscillating in the focus of the laser beam, and (ii) to calculate an electromagnetic force of the electric field based on a frequency and an amplitude of a motion of the nanoparticle.

8. The system of claim 7, wherein the at least one sensor comprises an array of photodiode sensors to monitor an interference between scattered light emitting from the nanoparticle and light from the laser beam that is not scattered by the nanoparticle, and determine a three-dimensional motion of the nanoparticle while the nanoparticle is oscillating at the trapping frequency in the focus of the laser beam.

9. The system of claim 7, wherein the at least one sensor comprises an electric image sensor to monitor the interference between the scattered light emitting from the nanoparticle and the light from the laser beam that is not scattered by the nanoparticle, and wherein the processor is to determine a three-dimensional motion of the nanoparticle while the nanoparticle is oscillating at the trapping frequency in the focus of the laser beam based on the monitored scattered light.

10. The system of claim 9, wherein the electric image sensor comprises any of a charge-coupled device (CCD) and a complementary metal-oxide semiconductor (CMOS) camera.

11. The system of claim 7, comprising a controller to tune the trapping frequency of the nanoparticle to be in resonance with the electric field.

12. The system of claim 11, wherein the controller comprises a modulator to control an intensity of the laser beam to tune the trapping frequency.

13. A method of identifying an electric field, the method comprising:
   focusing a laser beam in a vacuum chamber to define a trap region in the vacuum chamber;
   introducing a charged nanoparticle into the trap region;
   introducing an electric field proximate to the vacuum chamber;
   detecting positions of the nanoparticle as the nanoparticle oscillates at a trapping frequency in the trap region;
   calculating the electric field applied to the nanoparticle based on the detected positions and the trapping frequency of the nanoparticle;
   tuning the trapping frequency to be in resonance with the electric field; and
   calculating an electromagnetic force of the electric field based on positional changes of the nanoparticle.

14. The method of claim 13, comprising quantizing an electric charge applied to the nanoparticle.

15. The method of claim 13, wherein the calculating of the electromagnetic force of the electric field is based on changes in spatial coordinates of the nanoparticle at the trapping frequency.

16. The method of claim 13, wherein tuning of the trapping frequency comprises adjusting a power of the laser beam.

17. The method of claim 13, wherein tuning of the trapping frequency comprises controlling a size of the trap region.

18. The method of claim 13, comprising:
   arranging a plurality of vacuum chambers comprising respective oscillating nanoparticles into an array; and
   measuring the electric field at each of the vacuum chambers.

19. The method of claim 18, comprising:
   charging the nanoparticles to have different charges from one another; and
   differentiating signals received by the nanoparticles.

20. The method of claim 13, comprising:
introducing a plurality of oscillating charged nanoparticles in the vacuum chamber;
creating multiple beam trap regions in the vacuum chamber, wherein each beam trap region comprises a charged nanoparticle; and
measuring the electric field.

\* \* \* \* \*